United States Patent
Waheed et al.

(10) Patent No.: US 7,777,576 B2
(45) Date of Patent: Aug. 17, 2010

(54) DIGITAL PHASE LOCKED LOOP WITH GEAR SHIFTING

(75) Inventors: Khurram Waheed, Plano, TX (US); John Wallberg, Richardson, TX (US); Robert Bogdan Staszewski, Garland, TX (US); Sudheer Vemulapalli, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 145 days.

(21) Appl. No.: 12/137,332

(22) Filed: Jun. 11, 2008

(65) Prior Publication Data

US 2008/0315960 A1    Dec. 25, 2008

Related U.S. Application Data

(60) Provisional application No. 60/945,818, filed on Jun. 22, 2007.

(51) Int. Cl.
*H03L 7/093* (2006.01)
*H03L 7/16* (2006.01)

(52) U.S. Cl. ............... 331/17; 331/1 A; 331/16; 331/23; 331/25; 375/376; 455/260

(58) Field of Classification Search ............ 331/1 A, 331/16–18, 23, 25; 327/156–159; 330/10; 332/127; 360/51; 375/376; 455/260
See application file for complete search history.

(56) References Cited

U.S. PATENT DOCUMENTS 6,809,598 B1    10/2004   Staszewski et al.
7,046,098 B2    5/2006    Staszewski et al.
7,145,399 B2    12/2006   Staszewski et al.
7,183,860 B2    2/2007    Staszewski et al.
7,205,924 B2    4/2007    Vemulapalli et al.
2002/0080901 A1*  6/2002  Ham, III ............... 375/376

(Continued)

OTHER PUBLICATIONS

Khurram Waheed, et al., Injection Spurs Due to Reference Frequency Retiming by a Channel Dependent Clock at the ADPLL RF Output and its Mitigation, IEEE International Symposium on Circuits and Systems May 27-30, 2007, pp. 3291-3294.

(Continued)

*Primary Examiner*—David Mis
(74) *Attorney, Agent, or Firm*—Ronald O. Neerings; Wade James Brady, III; Frederick J. Telecky, Jr.

(57) ABSTRACT

An embodiment of the present invention provides a phase locked loop that operates on clock signals derived from an RF clock signal generated by the phase locked loop. A frequency reference input provides a reference clock. A controllable oscillator generates the RF clock signal. A phase detection circuit operates on the reference clock to provide digital phase error samples indicative of a phase difference between the reference clock and the RF clock. A programmable filter is connected to receive the phase error samples and connected to provide a filtered output having a gain and a phase margin to the controllable oscillator. The programmable filter includes a proportional loop gain control having a programmable loop gain coefficient (alpha—$\alpha$) and an integral loop gain control having a programmable loop gain coefficient (rho—$\rho$). Alpha and rho are configured to be programmatically changed simultaneously and are selected such that the gain is changed and the phase margin remains substantially unchanged.

23 Claims, 21 Drawing Sheets

U.S. PATENT DOCUMENTS

2003/0234693 A1* 12/2003 Staszewski et al. ............ 331/16
2006/0038710 A1    2/2006 Staszewski et al.
2007/0085622 A1    4/2007 Wallberg et al.
2007/0085779 A1    4/2007 Smith et al.

OTHER PUBLICATIONS

Robert Bogdan Staszewski, et al., All Digital PLL and Transmitter for Mobile Phones, IEEE Journal of Solid-State Circuits, vol. 40, No. 12, Dec. 2005, pp. 2469-2482.

Socrates D. Vamvakos, et al., Noise Analysis of Time-to-Digital Converter in All-Digital PLLs, IEEE Dallas/CAS Workshop on Design, Application, Integration and Software, Oct. 2006, pp. 87-90.

Robert Bogdan Staszewski, et al., All-Digital PLL and GSM/EDGE Transmitter in 90nm CMOS, ISSCC 2005, Session 17, RF Cellular ICs/17.5, Texas Instruments, Dallas, Pgs. Feb. 8, 2005, pp. 3.

Robert Bogdan Staszewski, A First Multigigahertz Digitally Controlled Oscillator for Wireless Applications, IEEE Transactions on Microwave Theory and Techniques, vol. 51, No. 11, Nov. 2003, pp. 2154-2164.

Texas Instruments, Hybrid Stochastic Gradient Based Digital Controlled Oscillator Gain KDCO Estimation IR-2 in U.S. Appl. No. 11/460,221.

Mahbuba Sheba, Adaptive Spectral Noise Shaping to Improve Time to Digital Converter Quantization Resolution Using Dithering, IR-8 U.S. Appl. No. 11/853,182, filed Oct. 1, 2007.

Khurram Waheed, Interpolative All-Digital Phase Locked Loop, U.S. Appl. No. 12/022,931, filed Jan. 30, 2008.

Mahbuba Sheba, Digital Phase Locked Loop with Dithering, U.S. Appl. No. 12/114,726, filed May 2, 2008.

Robert Bogdan Staszewski, Digital Phase Locked Loop with Integer Channel Mitigation, U.S. Appl. No. 12/024,881, filed Feb. 1, 2008.

* cited by examiner

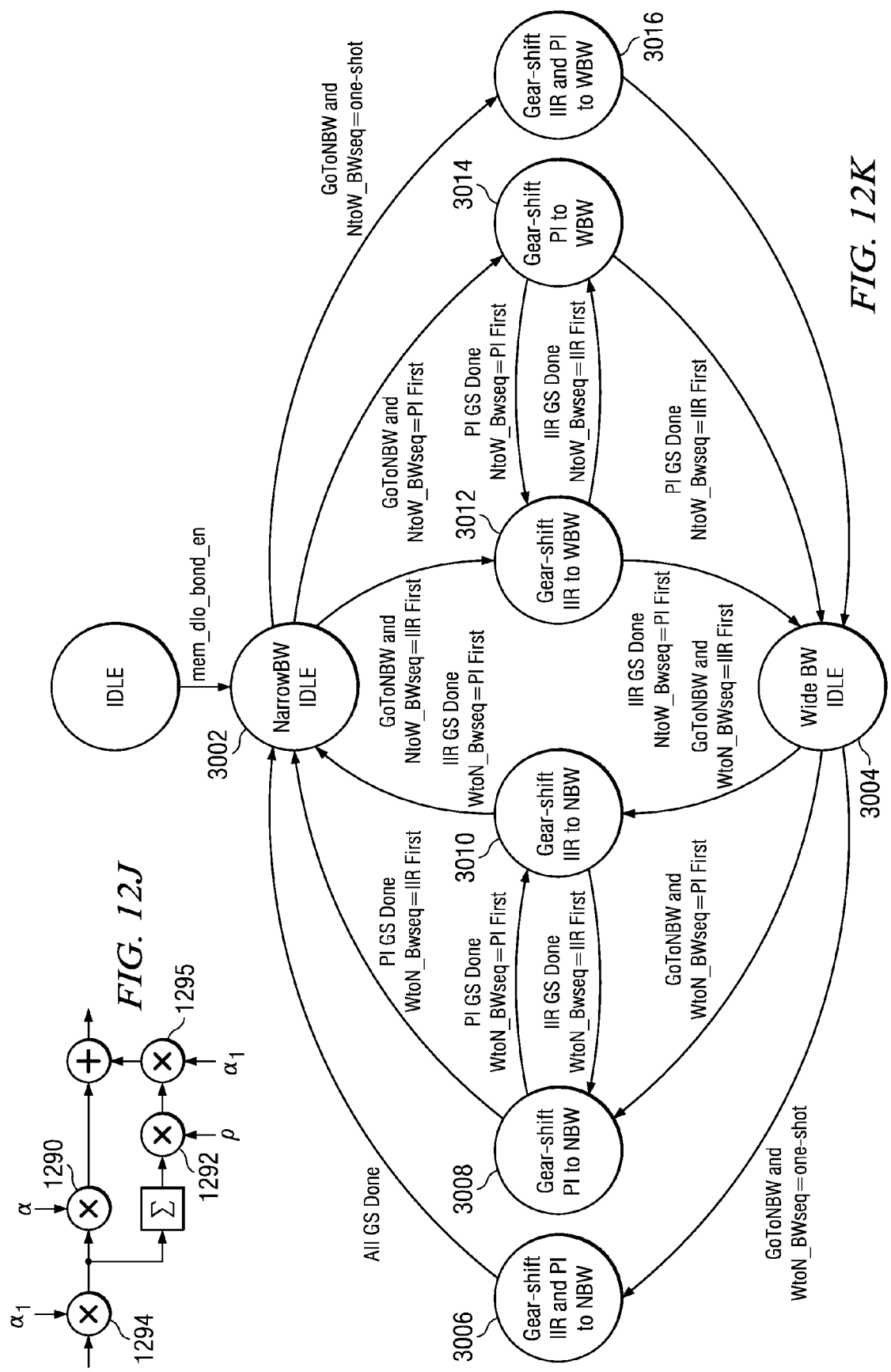

DIGITAL PHASE LOCKED LOOP WITH GEAR SHIFTING

CLAIM OF PRIORITY UNDER 35 U.S.C. 119(E) AND 35 USC 120

The present application claims priority to and incorporates by reference U.S. Provisional Application No. 60/945,818 filed Jun. 22, 2007, entitled "Interpolative All-Digital Phase Locked Loop". The present application also claims priority to U.S. application Ser. No. 11/551,050 filed Oct. 19, 2006 and entitled "CONTINUOUS REVERSIBLE GEAR SHIFTING MECHANISM"

FIELD OF THE INVENTION

This invention generally relates to the field of control systems and data communications. In particular, it relates to cellular telephony and communication devices such as Bluetooth, WLAN, etc. using all-digital radio frequency (RF) circuitry.

BACKGROUND OF THE INVENTION

With each successive cellular phone handset generation, users demand more features in a smaller form factor. Some recent examples include cell phones with integrated Bluetooth, GPS, digital camera, and MP3 functionality. Process shrinks help deliver a cost and size advantage for digital designs with relative ease. However, for analog/RF designs, the immaturity of advanced processes comes with design challenges that may outweigh the intended advantage. In a typical handset, 30 to 40% of handset board space is occupied by analog/RF functionality which cannot be re-designed or migrated to the newer process/technology nodes easily, inhibiting vendor ability to cost effectively add features and reduce footprint.

Digital radio has recently allowed the replacement of space consuming analog RF circuitry with much more compact digital circuitry, thereby facilitating the ability to port designs rapidly to more advanced lithographies. Texas Instruments (TI) has proven this concept with its Digital RF Processor (DRP™) architecture, which it has successfully implemented in production versions of its Bluetooth BRF6xxx transceivers, GSM/GPRS LoCosto TCS23xx transceivers among other chips. DRP implementation is consistent with the on-going trend toward RF-CMOS in the cellular area, making it attractive in terms of power consumption, cost, and the integration of multiple radios.

Oscillators are a key component in the design of radio frequency (RF) communication systems. The estimation and calibration of the modulation gain of an RF oscillator is currently an area of active research. Accurate knowledge of this gain significantly reduces the complexity and increases the performance of the phase-locked loop (PLL) as well as the transmit frequency modulation path. It is particularly beneficial in systems implemented in deep submicron CMOS and based on orthogonal frequency/phase and amplitude (i.e. polar) topology. Estimation of RF oscillator frequency-modulation gain is especially important in low-cost dominantly digital high-volume transceivers. In such systems, the phase locked loop sets the loop bandwidth while the transmitter sets the transfer function of the direct frequency modulation path wherein the acceptable gain estimation error ranges from less than 1% for LTE/WCDMA to several percents for EDGE, GSM and Bluetooth, for example.

An all-digital frequency synthesizer architecture built around a digitally controlled oscillator (DCO) that is tuned in response to a digital tuning word (OTW) is described in U.S. Pat. No. 7,046,098 entitled "All-digital frequency synthesis with capacitive re-introduction of dithered tuning information" and is incorporated by reference in its entirety herein. A gain characteristic ($K_{DCO}$) of the digitally controlled oscillator can be determined by observing a digital control word before and after a known change $\Delta.f_{max}$) in the oscillating frequency. This has been described in U.S. patent application Ser. No. 11/460,221 entitled "Hybrid Stochastic Gradient Based Digital Controlled Oscillator Gain $K_{DCO}$ Estimation". A portion (TUNE_TF) of the tuning word can be dithered and the resultant dithered portion can then be applied to a control input of switchable devices within the digitally controlled oscillator.

BRIEF DESCRIPTION OF THE DRAWINGS

Particular embodiments in accordance with the invention will now be described, by way of example only, and with reference to the accompanying drawings:

FIG. 12J is a block diagram illustrative of a way to perform gear shifting in the loop filter of FIG. 2;

FIG. 12K is a state diagram illustrating state transitions between a narrow bandwidth filter state and a wide bandwidth filter state in the loop filter of FIG. 2;

DETAILED DESCRIPTION OF EMBODIMENTS OF THE INVENTION

Figure 1:
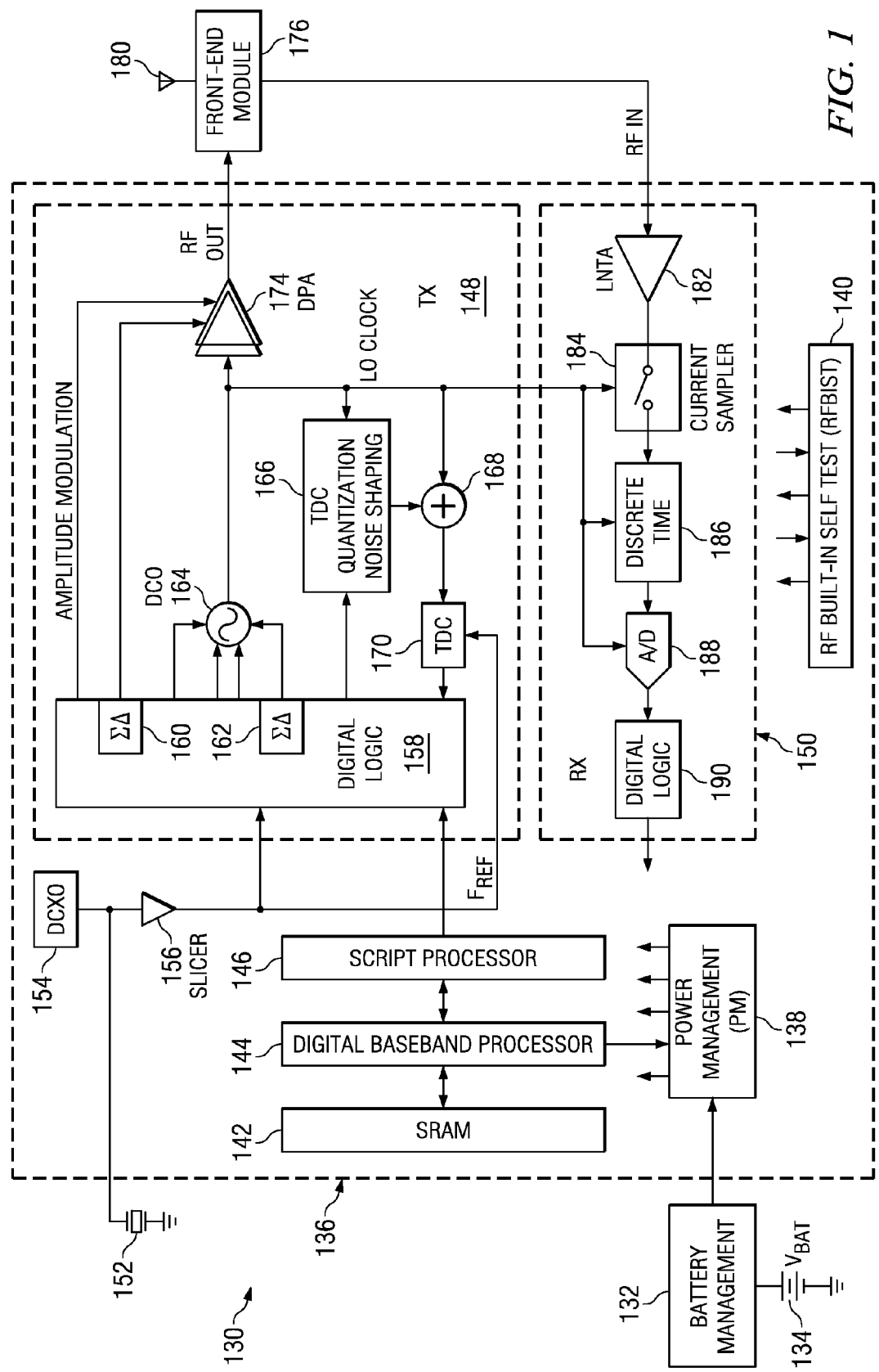
FIG. 1 is a block diagram of a single-chip radio with an all-digital local oscillator and transmitter and a discrete-time receiver.

The notation is used throughout this document is listed in Table 1.

TABLE 1

Glossary

| Term | Definition |
|---|---|
| ADPLL | All Digital Phase Locked Loop |
| ASIC | Application Specific Integrated Circuit |
| CDMA | Code Division Multiple Access |
| CKR | Retimed Reference Clock |
| CKV | Variable Oscillator Clock, (~2 GHz) equals channel frequency in HB and twice the channel frequency in LB |
| CMOS | Complementary Metal Oxide Semiconductor |
| DCO | Digitally Controlled Oscillator |
| DECT | Digital Enhanced Cordless Telecommunications |
| DPLL | Digital Phase Locked Loop |
| DRP | Digital RF Processor or Digital Radio Processor |
| EDGE | Enhanced Data rates for GSM Evolution |
| EDR | Enhanced Data Rate |
| FCW | Frequency Command Word is the ratio between variable clock frequency and the reference frequency, $$FCW = \frac{\text{Variable clock frequency}}{\text{Reference Frequency}}$$ |
| FDD | Frequency Division Duplex |
| FPGA | Field Programmable Gate Array |
| FREF | Frequency Reference |
| FSK | Frequency Shift keying |
| GFSK | Gaussian Frequency Shift Keying |
| GPRS | General Packet Radio Service |
| GSM | Global System for Mobile communications |
| HB | High Band |
| HDL | Hardware Description Language |
| IEEE | Institute of Electrical and Electronic Engineers |
| IIR | Infinite Impulse Response |

TABLE 1-continued

Glossary

| Term | Definition |
|---|---|
| KDCOINV | DCO Gain Normalization multiplier is the reciprocal of the DCO gain step normalized with the input sampling frequency, $$KDCOINV = \frac{\text{Datapath Sampling Frequency}}{\text{Estimated DCO Gain}}$$ |
| LB | Low Band |
| LDO | Low Drop-Out regulator |
| LFSR | linear feedback shift register |
| MOSCAP | Metal Oxide Semiconductor Capacitor |
| OTW | Oscillator Tuning Word is the normalization of the DCO modulation frequency ratio by the DCO gain, $$OTW = \frac{\text{Modulation Frequency}}{\text{Estimated DCO Gain}}$$ |
| PERINV | Period Normalization multiplier is the ratio between the nominal DCO clock frequency and an average inverter delay of the TDC, $$PERINV = \frac{\text{Variable clock time-period}}{\text{TDC Inverter Delay}}$$ |
| PHE | Phase Error |
| PLL | Phase Locked Loop |
| PVT | Process, Voltage, Temperature |
| RF | Radio Frequency |
| RTL | Register Transfer Logic |
| TDC | Time to Digital Converter |
| UMTS | Universal Mobile Telecommunications System |
| VCO | Voltage Controlled Oscillator |
| WCDMA | Wideband Code Division Multiple Access |
| WiMAX | Worldwide Interoperability for Microwave Access |
| WLAN | Wireless Local Area Network |

An Interpolative All-Digital Phase Locked Loop (iAD-PLL) is an enhanced version of the All-digital PLL (ADPLL) frequency synthesizer, which is described in U.S. Pat. No. 7,145,399 entitled "Type-II all digital phase locked loop (PLL)" as well as U.S. Pat. No. 7,183,860 entitled "Gain Calibration of a Digital Controlled Oscillator" each of which are incorporated by reference herein in their entirety. Also, U.S. Patent Publication No. 2006/0038710A1, published Feb. 23, 2006, Staszewski et al., entitled "Hybrid Polar/Cartesian Digital Modulator" and U.S. Pat. No. 6,809,598, to Staszewski et al., entitled "Hybrid of Predictive And Closed-Loop Phase-Domain Digital PLL Architecture," each of which are incorporated herein by reference in their entirety.

This advanced all-digital frequency synthesizer possesses two-point digital, i.e., reference and direct, frequency modulation capability. iADPLL, like its predecessor, uses digital signal processing and efficient circuit design techniques. A 4 or 8 GHz digitally-controlled oscillator (DCO) is at the heart of iADPLL, where fine frequency resolution is achieved through high-speed sigma-delta (ΣΔ) dithering. This setup allows for iADPLL loop control circuitry to be implemented in a fully digital manner using Infinite Impulse Response (IIR) filters and a digital Proportional-integral (PI) controller. For the feedback of DCO phase in the time-domain, very fine time resolution (~20 ps) is achieved by employing a Time-to-Digital Converter (TDC) comprising a chain of digital inverters.

The iADPLL architecture is distinct in that the loop filter and bulk of the logic operates on an RF derived variable clock domain. Due to the common RF based clock source for the major digital components, convenient digital handoff is achieved in the signal paths. The architecture uses two resamplers (one linear and the other a simple zero-order hold) for the exchange of data from and to the reference clock domain to the variable RF clock domain. In the variable clock domain, availability of several edge-aligned clock domains also facilitate physical register transfer logic (RTL) hardware sharing by time slicing. iADPLL can be embodied by more than one arrangement of the resampler and the other digital blocks. While several embodiments will be described herein, these descriptions are not intended to be limiting.

iADPLL architecture enhancements included in the various embodiments that will be described in more detail below aim at improving the spectral and the phase-domain performance of the original ADPLL architecture. In particular, the architectural changes use the DRP silicon area more efficiently as well as tackle the following critical aspects of the ADPLL design:

1. A reduction in the magnitude of the reference spurs is achieved by executing the loop filter in the iADPLL on a channel frequency derived clock. This significantly reduces the circuitry directly clocked by the reference clock or its retimed versions. Further, all the circuits interfacing to the DCO are being clocked at frequencies which are both higher and asynchronous to the reference frequency. Note that this arrangement necessitates the use of resampling circuits to deal with the multi-rate operation of the iADPLL. Mathematical analysis ensures the stability of iADPLL with these resamplers.

2. By using a direct point injection rate of channel frequency divided by 16, any sampling replicas are pushed to frequencies greater than 100 MHz from the carrier, where they are greatly attenuated by the DCO phase noise and loop skirt. Essentially these spurs are below the noise floor and do not appear in the simulations.

3. The use of a higher modulation injection rate also results in decreased spectral contribution of an iADPLL based transmitter in the GSM receive bands as described above. Further use of a higher direct-point injection frequency (>100 MHz) theoretically reduces the possibility of multiple spurs in the RX band.

4. A KDCO inverse calibration algorithm based on the Hybrid Stochastic Gradient (HSG) has been incorporated into iADPLL. This new algorithm ensures better than 1% accuracy of KDCO inverse estimate after initial compensation before each GSM burst under PVT. This aspect is described in more detail in U.S. patent application Ser. No. 11/460,221 entitled "Hybrid Stochastic Gradient Based Digital Controlled Oscillator Gain $K_{DCO}$ Estimation", filed Jul. 7, 2006 and incorporated by reference herein in its entirety.

5. Improved dithering mechanisms are used to counter the TDC quantization dead-band impediments in the iADPLL phase feedback path, especially in case of integer-N channels, i.e., when channel frequency is a multiple of reference frequency, as well as half-integer-N channels. Dithering has been improved to provide uniform phase-domain characteristics for all possible GSM channel frequencies.

6. A mechanism for quadrature phase rotation of the ADPLL feedback DCO variable frequency (CKV) at the input of the TDC. This forces the ADPLL to be operated in an offset feedback mode, where the frequency command word (FCW) for integer channel frequencies will not be integer any more (due to the introduced offset).

To aid in understanding the principles of the present invention, a description is provided in the context of a digital RF processor (DRP) transmitter and receiver that may be adapted to comply with a particular wireless communications standard such as GSM, Bluetooth, WCDMA, etc. It is appreciated, however, that the invention is not limited to use with any particular communication standard and may be used in control, optical, wired and wireless applications. Further, the invention is not limited to use with a specific modulation scheme but is applicable to any modulation scheme including both digital and analog modulation.

Note that throughout this document, the term communications device is defined as any apparatus or mechanism adapted to transmit, or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof. The notation DRP is intended to denote either a Digital RF Processor or Digital Radio Processor. References to a Digital RF Processor infer a reference to a Digital Radio Processor and vice versa.

A block diagram illustrating a single chip radio incorporating an interpolative all-digital local oscillator based polar transmitter and digitally-intensive receiver is shown in FIG. 1. For illustration purposes only, the transmitter, as shown, is adapted for the GSM/EDGE/WCDMA cellular standards. It is appreciated, however, that one skilled in the communication arts can adapt the transmitter illustrated herein to other modulations and communication standards as well without departing from the spirit and scope of the present invention.

The radio circuit, generally referenced 130, comprises a radio integrated circuit 136 coupled to a crystal 152, antenna front end module 176 connected to antenna 180 and battery management circuit 132. The radio chip 136 comprises a script processor 146, digital baseband (DBB) processor 144, memory 142 (e.g., static RAM), transmit (TX) block 148, receiver (RX) block 150, digitally controlled crystal oscillator (DCXO) 154, slicer 156, power management unit 138, RF built-in self test (BIST) 140. Battery 134 and battery management circuit 132 are connected to radio chip 136 for providing power. The TX block comprises high speed and low speed digital logic block 158 including $\Sigma\Delta$ modulators 160, 162, digitally controlled oscillator (DCO) 164, digitally controlled power amplifier (DPA) 174 or pre power amplifier (PPA), time-to-digital converter (TDC) circuit 170 and TDC quantization noise shaping block 166. The iADPLL and transmitter generate various radio frequency signals. The RX block comprises a low noise transconductance amplifier 182, current sampler 184, discrete time processing block 186, analog to digital converter (ADC) 188 and digital logic block 190.

The radio also comprises TDC quantization noise shaping block 166 operative to reduce the quantization noise contribution of the TDC. It is noted that the TDC quantization noise shaping mechanism is especially applicable in an ADPLL circuit.

The interpolated all-digital phase-locked loop (iADPLL) based transmitter employs a polar architecture with all digital phase/frequency and amplitude modulation paths. The receiver employs a discrete-time architecture in which the RF signal is directly sampled and processed using analog and digital signal processing techniques.

A key component is the digitally controlled oscillator (DCO) 164, which avoids any analog tuning controls. A digitally-controlled crystal oscillator (DCXO) generates a high-quality base station-synchronized frequency reference such that the transmitted carrier frequencies and the received symbol rates are accurate to within 0.1 ppm. Fine frequency resolution is achieved through high-speed ΣΔ dithering of its varactors. Digital logic built around the DCO realizes an interpolated all-digital PLL (iADPLL) that is used as a local oscillator for both the transmitter and receiver. The polar transmitter architecture utilizes the wideband direct frequency modulation capability of the iADPLL and a digitally controlled power amplifier (DPA) 174 for the amplitude modulation. The DPA operates in near-class-E mode and uses an array of nMOS transistor switches to regulate the RF amplitude and acts as a digital-to-RF amplitude converter (DRAC). It is followed by a matching network and an external antenna front-end module 176, which comprises a power amplifier (PA), a transmit/receive switch for the common antenna 180 and RX surface acoustic wave (SAW) filters. Fine amplitude resolution is achieved through high-speed ΣΔ dithering of the DPA NMOS transistors.

The receiver 150 employs a discrete-time architecture in which the RF signal is directly sampled at the Nyquist rate of the RF carrier and processed using analog and digital signal processing techniques. The transceiver is integrated with a script processor 146, dedicated digital base band processor 144 (i.e. ARM family processor and DSP) and SRAM memory 142. The script processor handles various TX and RX calibration, compensation, sequencing and lower-rate data path tasks and encapsulates the transceiver complexity in order to present a much simpler software programming model.

The frequency reference (FREF) is generated on-chip by a 38.4 MHz (but could be 26.0 MHz or other in another embodiment) digitally controlled crystal oscillator (DCXO) 154 coupled to slicer 156. An integrated power management (PM) system is connected to an external battery management circuit 132 that conditions and stabilizes the supply voltage. The PM comprises a switched mode power supply (SMPS) as well as multiple low drop out (LDO) regulators that provide internal supply voltages and also isolate supply noise between circuits, especially protecting the DCO. The SMPS is used for efficient conversion of the battery voltage to a level that can be used by on-chip LDOs. The RF built-in self-test (RFBIST) 140 performs autonomous phase noise and modulation distortion testing, various loopback configurations for bit-error rate measurements and implements various DPA calibration and BIST procedures. The transceiver is integrated with the digital baseband, SRAM memory in a complete system-on-chip (SoC) solution. Almost all the clocks on this SoC are derived from and are synchronous to the RF oscillator clock. This helps to reduce susceptibility to the noise generated through clocking of the massive digital logic.

The transmitter comprises a polar architecture in which the amplitude and phase/frequency modulations are implemented in separate paths. Transmitted symbols generated in the digital baseband (DBB) processor are first pulse-shape filtered in the Cartesian coordinate system. The filtered in-phase (I) and quadrature (Q) samples are then converted through a COordinate Rotation Digital Computer (CORDIC) algorithm into amplitude and phase samples of the polar coordinate system. The phase is then differentiated to obtain frequency deviation. The polar signals are subsequently conditioned through signal processing to sufficiently increase the sampling rate in order to reduce the quantization noise density and lessen the effects of the modulating spectrum replicas.

Figure 2:
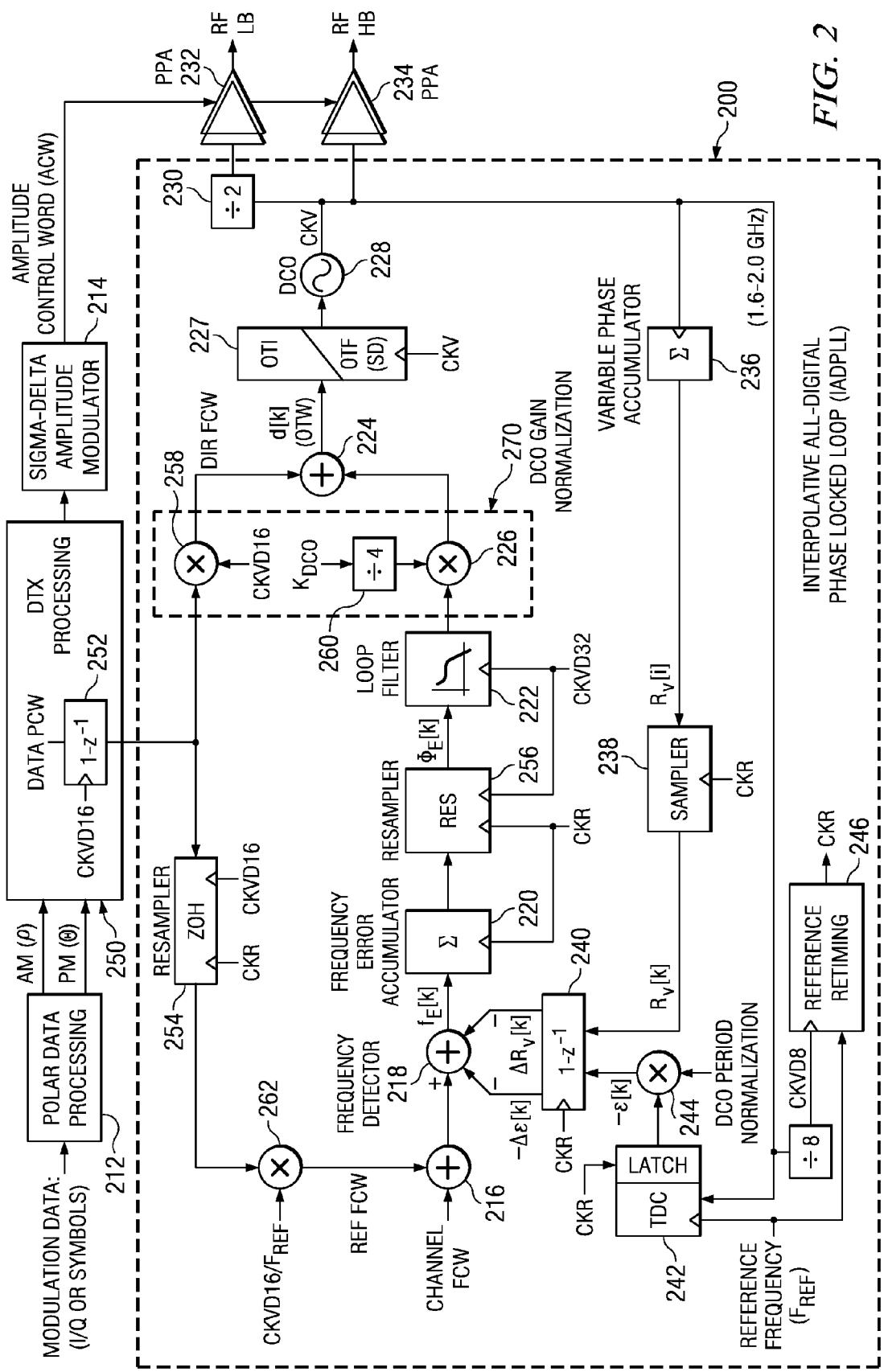
FIG. 2 is a more detailed block diagram illustrating the interpolative all-digital phase locked loop (iADPLL) based polar transmitter of FIG. 1 constructed in accordance with the present invention.

FIG. 2 is a more detailed block diagram of an iADPLL 200 used in the transceiver of FIG. 1 and constructed in accordance with the present invention. For illustration purposes only, the transmitter of the present embodiment is adapted for the GSM/EDGE cellular standard. It is appreciated, however, that one skilled in the communication arts can adapt the transmitter illustrated herein to other modulations and communication standards as well without departing from the spirit and scope of the present invention. For example, the transmitter illustrated in FIG. 1 can be extended for performing an arbitrary quadrature modulation scheme.

A description of the iADPLL, generally referenced 200, including the frequency/phase modulation path is provided herein below. The core of the iADPLL is a digitally controlled oscillator (DCO) 228 adapted to generate the RF oscillator clock CKV. The oscillator core (not shown) operates at twice the 1.6-2.0 GHz high frequency band or four times the 0.8-1.0 GHz low frequency band. The output of the DCO is then divided for precise generation of RX quadrature signals, and for use as the transmitter's carrier frequency. For GSM/EDGE transceivers, a single DCO is shared between transmitter and receiver and is used for both the high frequency bands (HB) and the low frequency bands (LB). However, for modern 3G (WCDMA) or other duplex transmission systems, separate local oscillators might be needed to supply TX and RX carrier frequencies.

A digitally-controlled oscillator (DCO) lies at the heart of the interpolated all-digital PLL (iADPLL) frequency synthesizer. It deliberately avoids any analog tuning voltage controls and is realized as an ASIC cell with truly digital inputs and outputs. The DCO comprises tunable switchable varactor elements, cross-coupled pairs of NMOS transistors, and a biasing circuit. The DCO varactors may be realized as n-poly/n-well MOS capacitor (MOSCAP) devices that operate in the flat regions of their C-V curves. Current advanced CMOS process lithography allows creation of extremely small-size but well-controlled varactors. The switchable capacitance of the finest differential TB varactor is in tens of attofarads. This resolution, however, is still too coarse for wireless applications and requires high-speed ΣΔ dithering to enhance the time-averaged frequency resolution, which is described in the following sections. The output of the DCO is input to the RF high band power amplifier 234. It is also input to the RF low band power amplifier 232 after divide by two in divider 230.

In case of transmit modulation, the symbols, (for example Gsm EDGE, wcdma, etc), in the form of in-phase and quadrature data streams are received from the digital baseband (DBB) circuit, not shown in this figure. The GSM symbols are passed through a pulse-shaping filter (PSF) within processor 212 that converts it to phase modulation. This phase modulation is interpolated in transmit data (DTX) processing circuit 250 and then passed on to the iADPLL after differentiation at the CKVD16 clock rate using differentiator 252. CKV is the iADPLL RF output digital variable clock in case of high-bands (HB>1 GHz) or twice the RF output clock in case of low-band (LB, <1 GHz).

For the case of EDGE, WCDMA, etc. the complex modulation I/Q data streams are fed to a COordinate Rotation Digital Computer (CORDIC) within processor 212, which converts it from Cartesian to polar representation. The amplitude modulation signal is passed through sigma-delta amplitude (SAM) signal processing blocks 214 before they are passed onto the on-chip digital pre-power amplifier (DPA) 234, while the phase modulation output of the cordic is passed onto iADPLL after the necessary interpolation and signal processing, which performs the phase modulation of the DCO.

Under no modulation conditions, iADPLL digitally controls the DCO to produce a stable variable clock (CKV) in the targeted RF frequency band. In the feedback path, CKV is used for phase detection and reference retiming. The time to digital phase conversion in the feedback happens using a TDC inverter chain 242.

The channel and data frequency control words are in the frequency command word (FCW) format, which is defined as the fractional frequency division ratio N, with a fine frequency resolution limited only by the FCW word-length. For example, with 24 fractional FCW bits, the frequency granularity using a 38.4 MHz reference frequency is 38.4 MHz/$2^{24}$≅2.29 Hz. In this embodiment, the direct point frequency injection is at the CKVD16 (which is 1×HB/2×LB channel frequency divided by 16, i.e., CKVD16=$f_V$/16) rate, so the possible DCO frequency resolution is in the range of 6~7.5 Hz (computed as $f_V/16/2^{24}$).

The frequency reference (FREF) clock contains the only reference timing information for the RF frequency synthesizer to which phase and frequency of the RF output are to be synchronized. The RF output frequency ($f_V$) is related to the reference frequency $f_R$ according to the following formula.

$$f_V = N \cdot f_R \qquad (1)$$

where, N=$f_V/f_R$≡FCW.

Synchronous Phase-Domain Operation

The iADPLL operates in a digitally-synchronous fixed-point phase domain. The variable phase $R_V[i]$ is determined by counting the number of rising clock transitions of the DCO oscillator clock CKV using variable phase accumulator 236. The variable phase $R_V[i]$ is sampled via sampler 238 to yield sampled FREF variable phase $R_V[k]$, where k is the index of the FREF edge activity. The sampled FREF variable phase $R_V[k]$ is fixed-point concatenated with the normalized time-to-digital converter (TDC) 242 output $\epsilon[k]$. The TDC measures and quantizes the time differences between the frequency reference FREF and the DCO clock edges. The sampled differentiated (via block 240) variable phase is subtracted from the frequency command word (FCW) by a synchronous arithmetic phase detector 218. The reference phase $R_R[k]$ (equivalent to PHR in FIG. 5) is conceptually obtained by accumulating FCW with every cycle of the retimed frequency reference (FREF) clock input.

The frequency error $f_E[k]$ samples are accumulated via the frequency error accumulator 220 to create the phase error $\Phi_E[k]$ samples. The digital phase error $\Phi_E[k]$ is filtered by a digital loop filter 222 and then normalized by the DCO gain normalization circuit 270 in order to correct the DCO phase/frequency in a negative feedback manner. The loop behavior due to its digital nature is independent of process, voltage and temperature variations. The FREF retiming quantization error $\epsilon[k]$ is determined by the time-to-digital converter (TDC) 242 and the DCO period normalization multiplier 244. The TDC is built as a simple array of cascaded inverter delay elements and flip-flops, which produces time conversion resolution finer than 25 ps in the design process.

It must be recognized that the two clock domains, FREF and DCO, are not entirely synchronous and it is difficult to physically compare the two digital phase values without having to face meta-stability problems. During the frequency acquisition, their edge relationship is not known and during the phase lock the edges will exhibit rotation if the fractional FCW is non-zero. Consequently, the digital-word phase comparison is performed in the same clock domain. The synchronous operation is achieved by over-sampling the FREF clock using a higher-rate DCO derived clock (typically CKVD8) in reference retiming circuit 246. The resulting retimed CKR clock is thus stripped of the FREF timing information and is used throughout the system. This ensures that the massive digital logic is clocked after the quiet interval of the phase error detection by the TDC.

The main advantage of representing the phase information in fixed-point digital numbers is that, after the conversion, it cannot be further corrupted by noise. Consequently, the phase detector could be simply realized as an arithmetic subtractor that performs an exact digital operation. Thus, having a single conversion place, where the continuously-valued clock transition edge delay is quantized within the TDC, the susceptibility to noise and quantization errors is minimized and well controlled. It should be emphasized that it is very advantageous to operate in the phase domain for several reasons. First, the phase detector used is not a conventional correlative multiplier generating reference spurs. DRP architecture uses an arithmetic subtractor 218, which does not introduce any spurs into the loop. Second, the dynamic range of the phase error could be made arbitrarily large simply by the increasing word-length of the phase/frequency accumulators. Conventional three-state phase/frequency detectors are typically limited to only ±2π of the compare rate. Third, the phase domain operation is more amenable to digital implementations, contrary to the conventional approach.

High-Speed Direct Frequency Modulation Capability

As shown in FIG. 2, the oscillating frequency deviation Δf is dynamically controlled by directly modulating the DCO frequency in a feed-forward manner. The iADPLL loop compensates by effectively removing the loop dynamics from the modulating transmit path (using the reference modulation injection). The remainder of the loop, including all error sources, operates under the normal closed-loop regime. This method is similar to the conventional two-point direct modulation scheme but because of the digital nature, it is exact and does not require any analog component matching, except for the DCO gain $K_{DCO}=\Delta f/\Delta OTW$ calibration, which is achieved in using a robust hybrid stochastic-gradient algorithm implemented in digital domain, where OTW is the oscillator tuning word and is analogous to the voltage tuning of a VCO.

The fixed-point frequency modulating data FCW is over-sampled in resampler 254 by the iADPLL DCO injection frequency $f_V/16$ and normalized in multiplier 262 to the value of iADPLL DCO injection frequency $f_V/16$. Using the direct injection of the normalized FCW directly at the DCO impacts the oscillating frequency. The PLL loop will try to correct this perceived frequency perturbation integrated over the update period of $1/f_R$, which is then interpolated to the iADPLL operational frequency of $f_V/32$ in resampling interpolator 256. This corrective action is compensated by the other (compensating) reference feed that is integrated by the reference phase accumulator. If the estimated DCO gain is accurate, i.e., $\hat{K}_{DCO} \cong K_{DCO}$, then the loop response to the modulation is flat from dc to $f_V/64$ (or half of iADPLL operational frequency $f_V/32$). The immediate and direct DCO frequency control, made possible by accurate prediction of the DCO transfer function, is combined with the phase compensation of the PLL loop response. The two factors constitute the hybrid of predictive/closed PLL loop modulation method.

Advantages of Using Higher Rate Direct-Point Modulation Injection

One of the key advantages of using a direct point injection rate (say of channel frequency divided by 16) is that the phase modulation can be presented to the DCO with a finer resolution. For example, the phase modulation in GSM has a BW of 200.00 kHz, while for a polar TX, in EDGE mode the phase modulation BW is approx. 2.0 MHz (LB) and 1.0 MHz (HB).

The CKVD16 rate corresponds to an injection frequency range of 103-124 MHz, which is at least three times higher than an FREF of 38.4 MHz, and 4 times higher than an FREF of 26 MHz. This implies that the phase modulation data update using a CKVD16 rate will be 3-4 times finer than the FREF rate used in the previous generations of ADPLL.

Furthermore, the data injection into the DCO comprises an integer and fractional parts, described in more detail below. The injection rate creates an effective zero order hold (ZOH) at resampler 254. The ZOH operation does not provide a large attenuation to the sampling replicas, which is only 13 dB lower for 2nd harmonic and approx. 17 dB for 3rd harmonic. As CKVD16 frequency is much higher than FREF, these replicas are correspondingly at 3-4 times higher frequency for CKVD16 (>100 MHz) vs. FREF (26-38.4 MHz). The DCO phase noise beyond the flicker corner of 1-2 MHZ has a 20 dB/decade slope, which implies that the residual sampling replicas after ZOH 254 sync filtering will receive an additional attenuation of 12 dB using CKVD16 injection rate as compared to FREF. In short, use of CKVD16 for direct point phase modulation injection results in pushing any sampling replicas to frequencies greater than 100 MHz from the carrier, where they are greatly attenuated by the DCO phase noise and the spectral skirt of the loop filter. Essentially these signal processing spurs are below the noise floor and can not be seen in simulations or measurements.

Another important benefit of using CKVDx, where x=16 or 8 for direct point injection is that the quality of phase modulation injection becomes independent of the FREF frequency. The same iADPLL when used with different FREF's, say 26, 38.4 or 52 MHz will exhibit the same direct point injection fidelity. However, note that there are other noise scaling terms that will be impacted by the FREF frequency change, but the iADPLL loop filters, modulation injection rates etc. will maintain their resolution across multiple possible reference frequencies.

It has been observed in previous versions of the ADPLL that the current spikes caused by clocking of bulk of the logic can be a source of spurious emissions. This is especially true for highly integrated transceivers targeted using DRP technology. For iADPLL, a significant part of the loop filter and DCO interface logic executes on the LO derived clock domain. Since most of these frequencies are chosen to be higher than FREF, any such spurious products will have a larger intra-spur distance than FREF. For example, using CKVD32, the spurs (if present) will be 52-62 MHz apart as compared to FREF frequencies. In retrospect, the current spikes due to the modulation injection rate into DCO have the highest impact, as the rush current to the boundary level-shifters might be supplied by the same LDO supply regulator, which powers DCO. The most critical among these spurs are the ones that appear in the corresponding GSM/EDGE RX band during transmission. The widest GSM RX band is 65 MHz, and using CKVD16 at the interface at most one spur may appear in the RX band due to these parasitic supply regulation issues. Therefore, the use of a higher direct-point injection frequency (>100 MHz) theoretically reduces the possibility of multiple spurs in the RX band.

Figure 3:
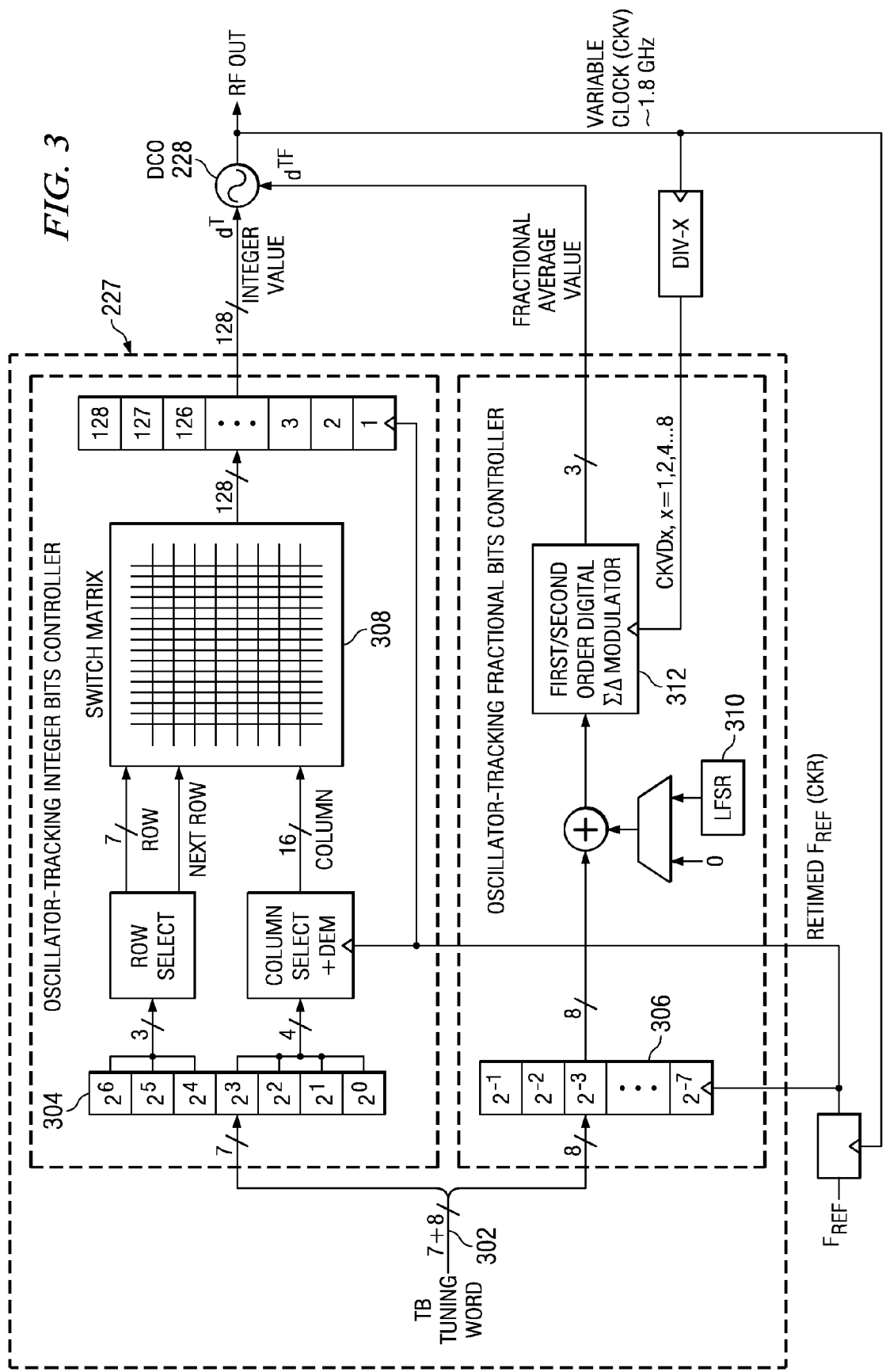
FIG. 3 is a block diagram of the digitally controlled oscillator (DCO) of FIG. 2 illustrating in more detail tracking bits with dynamic element matching (DEM) of the integer part and sigma-delta (SD) dithering of the fractional part.

FIG. 3 is a block diagram of the digitally controlled oscillator (DCO) of FIG. 2 illustrating tracking bits with dynamic element matching (DEM) of the integer part and sigma-delta (SD) dithering of the fractional part. The digitally-controlled quantized capacitance of the LC tank is split into four major varactor banks that are sequentially activated during frequency locking. Large 1.8-2.5 MHz steps are performed during a process-voltage-temperature (PVT) calibration modes using a MIM-capacitor PVT bank (PB). Smaller 250-450 kHz steps of the acquisition bank (AB) are used during a channel select. The finest tens of kHz steps of the tracking bank (TB) are used during the actual transmit and receive. The unit weighted tracking bank is further partitioned into 32 or more integer and 3 fractional varactors. The fractional varactors undergo high-speed $\Sigma\Delta$ dithering via a $1^{st}$ and $2^{nd}$ order digital $\Sigma\Delta$ dithering circuit 312.

FIG. 3 illustrates an oscillator tuning mechanism 227 that improves the DCO 228 frequency resolution beyond the basic 100 kHz frequency step of the TB varactors. The 15 fixed-bit oscillator tuning word (OTW) 302 is split into seven integer 304 and eight fractional bits 306. In other embodiments, based on the configuration of the DCO varactor banks, the integer bit can be scaled to be five or six, for example. The LSB of the integer part (TB varactor) corresponds to the minimum frequency step of the DCO. Within the DCO, the integer part is thermometer encoded to control the same-size DCO varactors. This guarantees monotonicity and helps to achieve adequate linearity. The switch matrix 308, together with the row and column select logic, operates as a binary-to-unit-weighted encoder in response to the integer part of the TB tuning word. To minimize the impact on DCO linearity due to TB varactor mismatches, dynamic element matching (DEM) mechanisms that perform rotation of the TB row varactors have been built into the design.

The fractional part, on the other hand, employs a time-averaged dithering that produces a high-rate integer stream whose time-averaged value equals the lower-rate fractional TB input. The spurs due to sigma-delta ($\Sigma\Delta$) idle tones are randomized using an linear feedback shift register (LFSR) 310 dithering of the fractional word. Use of the second order $\Sigma\Delta$ 312 and the high speed modulator clock speed (as high as CKVD1, i.e., 1.8 GHz), makes the in-band oscillator phase noise degradation almost immeasurable. With eight fractional bits and an integer bit size of 100 kHz, the effective open-loop DCO resolution will be 100 kHz/$2^8$=390.625 Hz, which is sufficient for GSM applications.

The fractional path of the DCO tracking bits is entirely separated from the lower-rate integer part. It even has a dedicated DCO input just to avoid "contamination" of the rest of the tracking bits with frequent transitions. The $\Sigma\Delta$ modulator 312 is responsive to only the fractional part of the tracking tuning word. Under certain operational conditions, especially when the input of the $\Sigma\Delta$ modulator 312 is a small but constant fraction, the $\Sigma\Delta$ output may exhibit spurs due to the cyclic pattern being generated by the modulator. These spurious products are called idle tones, which can be avoided by enabling an LFSR 310 output which gets added to raw input to create a dithered input to the $\Sigma\Delta$ modulator. The $\Sigma\Delta$ output becomes free of these idle tones by using the described mechanism.

The actual merging of both parts is performed inside the oscillator through time-averaged capacitance summation at the LC tank. Thus the critical high-speed arithmetic operations are performed in the "analog domain" through the additions of capacitance inside the DCO.

Figure 4:
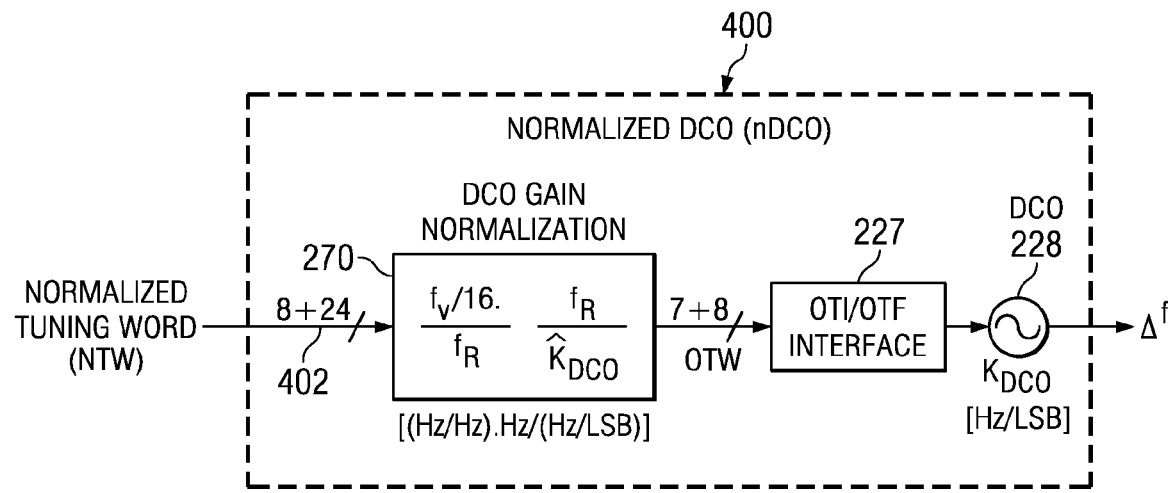
FIG. 4 is a normalized abstraction layer of the DCO of FIG. 3.

FIG. 4 is a normalized abstraction layer of the DCO of FIG. 3. At a higher level of abstraction, the DCO oscillator 228 together with the equivalent DCO gain normalization multiplication, results in a gain of:

$$\frac{f_v/16}{\hat{K}_{DCO}} = \frac{f_v/16}{f_R} \cdot \frac{f_R}{\hat{K}_{DCO}}$$

The above equation logically comprises the normalized DCO (nDCO) 400, as illustrated in FIG. 4 for the data modulating path. The DCO gain normalization circuitry 270 (referring to FIG. 2) conveniently decouples the phase and frequency information throughout the system from the process, voltage and temperature variations that normally affect the $K_{DCO}$. The frequency information is normalized to the value of the CKVD16 (1×HB/2×LB CKV frequency divided by 16, $f_V/16$) injection frequency from the DTX 250/252. The DCO interface is updated at the CKVD16 rate (which is also the direct point frequency modulation injection rate) via multiplier 258 at the adder 224. The decomposition of the $$\frac{f_V/16}{\hat{K}_{DCO}}$$

DCO normalization factor, shown above, accounts for the interpolation already done on the digital frequency modulation data.

For clarity, note that the iADPLL phase accumulation 220 happens at the CKR (or FREF) rate, the remainder of the loop filters operates at the CKVD32 rate, see FIG. 2. The phase-domain resampling 256 from the CKR to CKVD32 rate serves to translate the data from one clock domain to the other using embedded interpolative filtering. This does not change the phase accumulation rate (which is CKR), which requires the correct DCO normalization to be $$\frac{f_R}{\hat{K}_{DCO}}.$$

However, in order to derive this reference signal normalization from the $$\frac{f_V/16}{\hat{K}_{DCO}}$$

factor, which is precisely estimated by adaptation, a scaled version of $$\frac{f_V/16}{\hat{K}_{DCO}}$$

is used for the scaling 226 of the iADPLL loop correction applied to the DCO. For a scaling 260 by 2, the missing factor of $$\frac{f_R}{f_V/32}$$

is considered as a part of the PI controller tuning parameters (i.e., proportional gain, α and integral gain, ρ). This avoids the use of an additional multiplier in the architecture.

The digital input to the Normalized DCO (nDCO) is a fixed-point normalized tuning word (NTW), whose integer part LSB bit corresponds to CKVD16. The quantity $K_{DCO}$ should be contrasted with the process-temperature-voltage-independent oscillator gain $K_{nDCO}$ which is defined as the frequency deviation (in Hz units) of the DCO in response to the 1 LSB change of the integer part of the NTW input. If the DCO gain estimate is exact $K_{nDCO}=f_V/(16\times LSB)$, where $f_V/16$ is the direct point modulation injection rate. If there is a $K_{DCO}$ estimation error, then $$K_n DCO = \frac{f_V}{16 \times LSB} \cdot \frac{K_{DCO}}{\hat{K}_{DCO}} = \frac{f_V}{16 \times LSB} \cdot r \quad (2)$$

The dimensionless ratio $r=K_{DCO}/\hat{K}_{DCO}$ is a measure of the accuracy of the DCO gain estimate.

Figure 5:
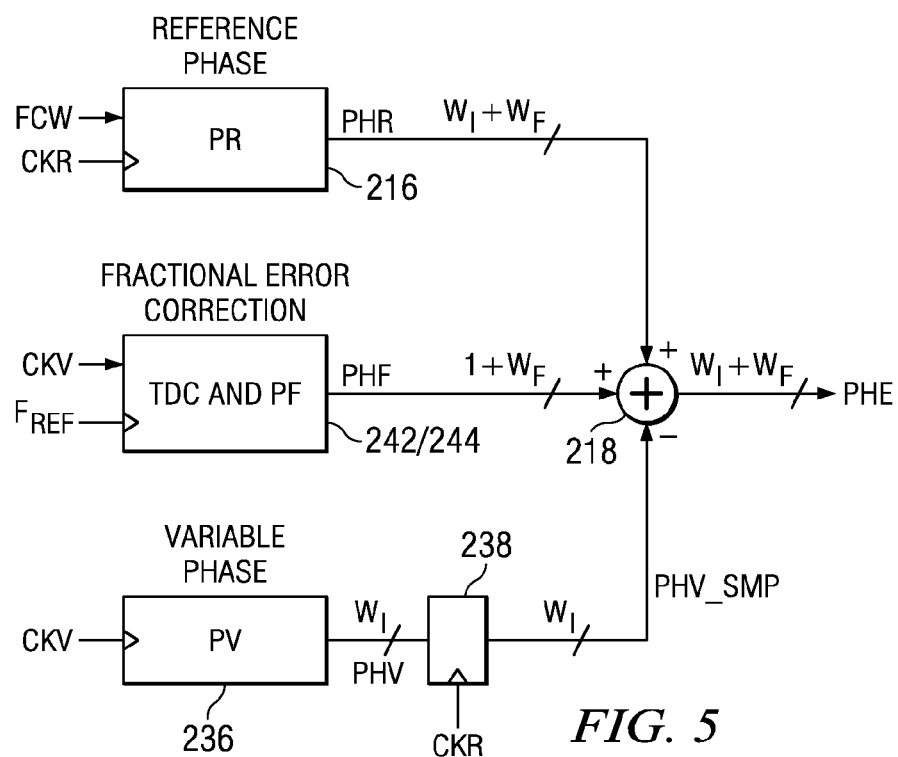
FIG. 5 illustrates a general block diagram of a phase detection mechanism used in the iADPLL of FIG. 2.

FIG. 5 illustrates a general block diagram of the phase detection mechanism that can be mathematically captured as:

$$\phi_E[k]=R_R[k]-R_V[k]+\epsilon[k] \quad (3)$$

The operation consists of the phase detector 218 itself (see also FIG. 2, which shows a mathematically equivalent version), which operates on the three phase sources: reference phase $R_R[k]$ from adder 216, variable phase $R_V[k]$ from sampler 238, and the fractional error correction $\epsilon[k]$ from DCO period normalizer 244. The actual variable phase $R_V[i]$ from accumulator 236 is clocked by the CKV clock of index I and it must be resampled 238 by the CKR clock of index k. After the PHV resampling, all the three phase sources are synchronous to the CKR clock which guarantees the resulting phase error $\phi_E[k]$ to be also synchronous. An extra output bit from the fractional phase error correction comprising TDC and PF is due to metastability avoidance and is explained in the following sections.

The measurement of variable phase (i.e., the phase of the DCO output, CKV) is carried out in two steps. The integer part (i.e., the integer number of the CKV clock cycles) is determined using a non-resettable CKV edge counter called Variable Phase Accumulator 236. The remainder is the fractional part of the phase, which is the estimation of the sub-CKV clock period estimation of phase between FREF and the nearest CKV edge. This step is carried out by the time-to-digital converter (TDC) 242 described in the next section.

Integer Variable Phase Accumulation

The integer part of the variable phase comprises a count of the complete CKV clock cycles. The variable phase accumulator 236 implements the DCO clock count incrementing with the rollover effect as described in the following equation.

$$R_V(i \cdot T_V) = R_V[i] = \sum_{l=0}^{i} 1$$

The deep submicron CMOS process is fast enough to perform an 8-bit binary incrementer at 2 GHz clock in one cycle using a simple carry-ripple structure. Critical timing of this operation would comprise a chain of seven half-adders and an inverter. However, for a commercial application it was necessary to add an extra timing margin in order to guarantee robust operation with acceptable yield for all the process and environmental conditions, as well as anticipated clock distribution skew statistics. This extra margin was obtained by increasing the maximum operational speed through topological means. The carry-ripple binary incrementer was transformed into two separate smaller incrementers, not shown. The first high-speed incrementer operates on the two lower-order bits and triggers the higher order increment whenever its count reaches "11". The second incrementer operates on the same CKV clock, but the 6-bit increment operation is allowed now to take four clock cycles. The long critical path of the 8-bit carry-ripple incrementer has thus been split into smaller parts allowing for the necessary timing margin.

Time-to-Digital Converter (TDC)

Figure 6:
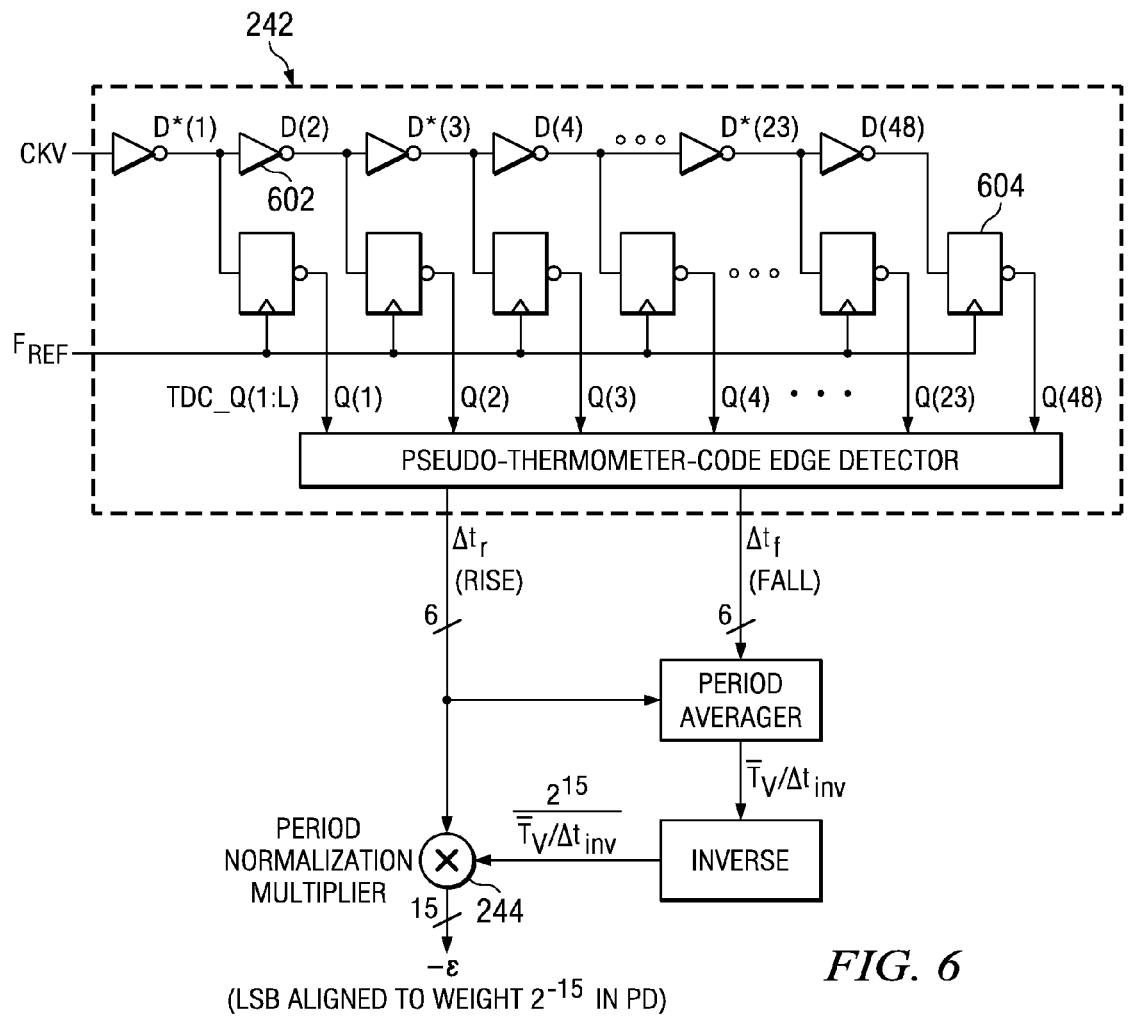
FIG. 6 is a block diagram of the time-to-digital converter (TDC) of FIG. 2.

FIG. 6 is a block diagram of the time-to-digital converter (TDC) 242 of FIG. 2. The TDC estimates the fractional part of the variable phase between the reference frequency edge and the next nearest edge of the DCO CKV clock. The TDC operates by passing the DCO clock through a chain of inverters 602. The delayed clock vector is then sampled by the FREF clock using an array of registers 604 whose outputs form a pseudo-thermometer code. The decoded binary TDC output is normalized 244 by the DCO clock period $T_V$ before feeding it to the loop. The combination of the arithmetic phase detector and the TDC is considered to be a replacement of the conventional phase/frequency detector. The number of TDC taps, L=56, has been determined as the count of inverters needed to cover the full DCO period under the strong process corner (min $t_{inv}$=15 ps) plus some margin. Other embodiments may possess a different TDC topology and have fewer or more taps, depending on process parameters.

TDC resolution is a single inverter delay, $\Delta t_{inv}$, which in this deep-submicron CMOS process is considered the most stable logic-level regenerative delay and in the 65 nm process node is approximately 20-25 ps. This results in a quality phase detection mechanism, as evidenced by the close-in and rms phase noise measurement results of the DRP architecture. While other TDC architectures can achieve the TDC resolution that is better than one inverter delay, they are quite complex and analog intensive. They simply appear not needed for GSM applications in this deep-submicron CMOS process when $\Delta t_{inv}$=25 ps can be easily achieved The phase quantization resolution of the variable phase accumulator 236, as described in the preceding section, is limited to ±½ of the DCO CKV clock cycle, $T_V$. For wireless applications, a finer phase resolution is required. This is achieved using time-to-digital converter (TDC). The TDC measures the fractional delay difference ε between the reference clock and the next rising edge of the DCO clock. Using the TDC, the integer clock-domain quantization error is corrected by means of the fractional error correction term computed by the TDC, where the time between the rising and falling edges of CKV and FREF follow the relationship below $$\frac{T_V}{2} = \begin{cases} \Delta t_r - \Delta t_f & \Delta t_r \geq \Delta t_f \\ \Delta t_f - \Delta t_r & \text{otherwise} \end{cases} \quad (4)$$

Therefore, the total variable phase in the feedback path is $R_V[k]-\epsilon[k]$. As the iADPLL phase comparator is implemented in the frequency domain, which is mathematically equivalent to the pure phase domain operation, the variable phase is differentiated 240 to estimate the variable frequency error, i.e., $$f_e^V[k]=(R_V[k]-\epsilon[k])-(R_V[k-1]-\epsilon[k-1]) \quad (5)$$

Figure 7A:
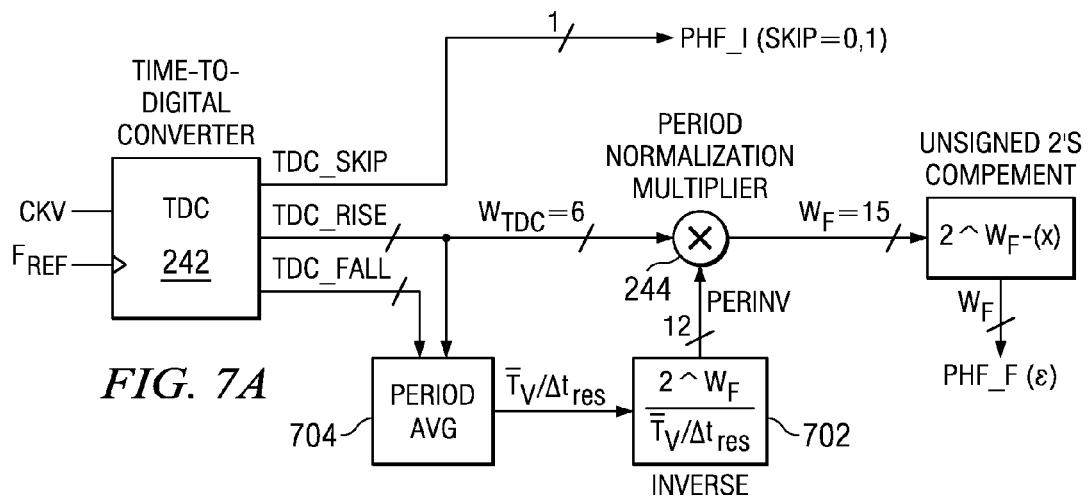
FIGS. 7A and 7B illustrate normalization and edge skipping operation of the TDC.
Figure 7B:
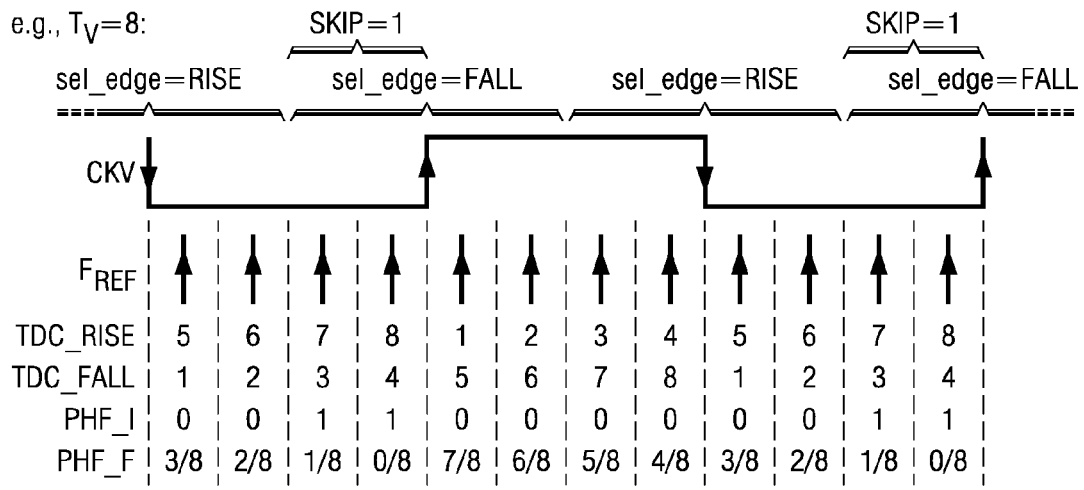

FIGS. 7A and 7B illustrate normalization and edge skipping operation of the TDC. The dimensionless TDC normalizing factor output from inversion circuit 702 is represented as follows:

$$N_{TDC} = \frac{2^{W_F}}{T_V/\Delta t_{res}} \quad (6)$$

$N_{TDC}$ is a fixed-point representation of the inverse of the expected DCO period $T_V$ in units of inverter delays $\Delta t_{res}=t_{inv}$. It is obtained through long-term averaging 704 of $$T_V=2|\Delta t_r-\Delta t_f|$$

(in inverter units) followed by inversion 702.

The averaging time constant could be as slow as the expected drift of the inverter delay, possibly due to temperature and supply voltage variations. The instantaneous value of the clock period $T_V=2|\Delta t_r-\Delta t_f|$ is an integer but averaging results in addition of significant fractional bits to the integer estimate with longer operations.

$$\overline{T}_V = \frac{1}{N_{avg}} \sum_{k=1}^{N_{avg}} T_V[k] \quad (7)$$

Note that each doubling of the accumulation length $N_{avg}$ would add one bit to the $T_V$ resolution.

It was experimentally confirmed that accumulating 128 clock cycles would produce accuracy within 1 ps of the inverter delay. The length of the operation is chosen to be a power of 2 since the division by the number of samples $N_{avg}$ could now be replaced with a simple shift-right operation. Of course, other embodiments using a different technology or process point may use a different number of accumulations.

Resampling Operation in the iADPLL

Figure 8A:
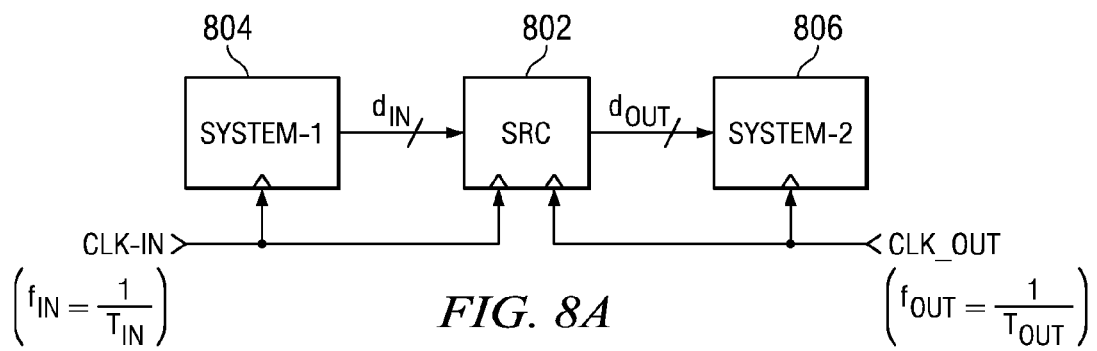
FIGS. 8A and 8B illustrate a conceptual view of data resampling using a sample rate converter.
Figure 8B:
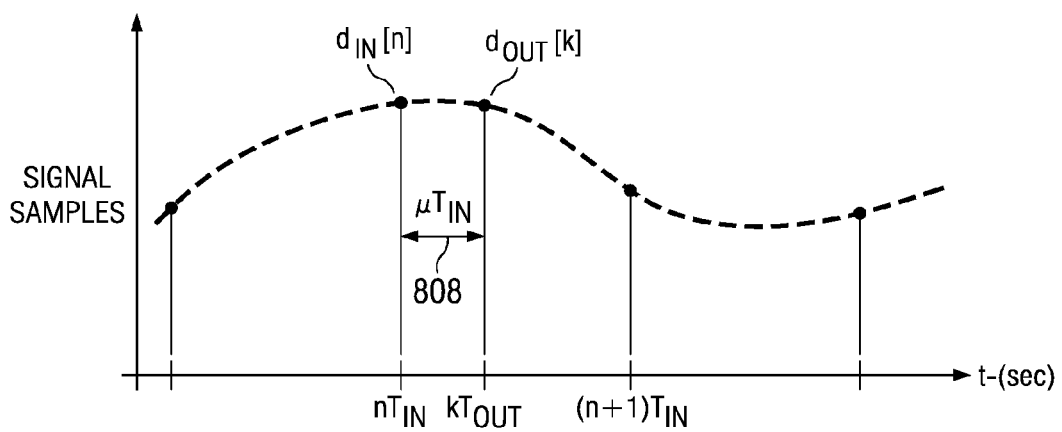

FIGS. 8A and 8B illustrate a conceptual view of data resampling using a sample rate converter 802. This section describes the resampling operations done in the iADPLL on the reference path and the phase error feeding into the loop filters. The sample rate conversion (SRC) or resampling is the mechanism with which data can be handed-off between digital systems (or circuits) which can have independent asynchronous clocks, such as example system-1 804 and system-2 806. The choice of the resampling mechanism determines the fidelity of the signal as it is passed from one clock domain to the other. The resampling operation can be as simple as a having a set of boundary registers on both the clock-domains, known as zero-order hold, ZOH; may contain linear polynomial interpolation, known as first-order hold; or more advanced polynomial filtering schemes such as Gardner, Lagrange, or Cubic Spline interpolations to name a few. For a resampler, the maximum difference in sample times indicated by 808 and the rate of change in the sampled signal determine how faithfully the output signal $d_{OUT}[k]$ tracks the input signal $d_{IN}[n]$.

In case of iADPLL, the two clock domains around the resampling domains are either the reference clock (FREF) or the retimed reference clock (CKR) and the CKV-derived clock. Although these two clocks are in general asynchronous to each other, the CKV being the output of iADPLL has a known relationship with FREF, which is tracked by the variable phase in the feedback path of the iADPLL. This information is used to efficiently resample the data between the above mentioned clock domains.

Figure 9A:
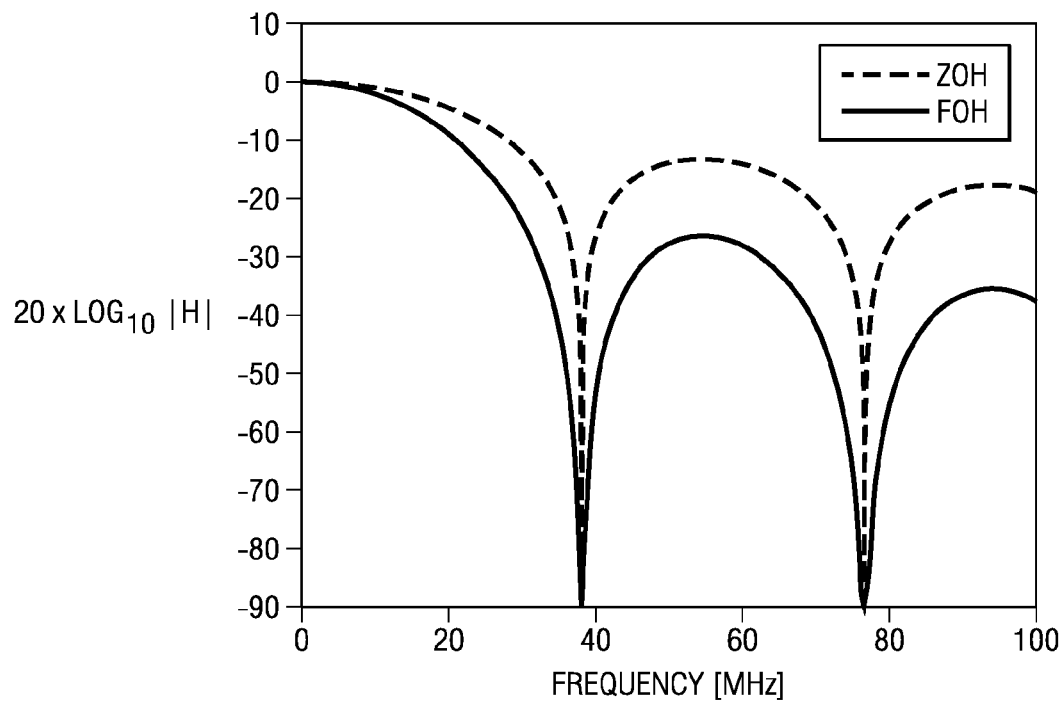
FIG. 9A is a magnitude response plot and FIG. 9B is a phase response plot for the zero-order hold (ZOH) and first-order hold (FOH) resamplers of the iADPLL of FIG. 2.
Figure 9B:
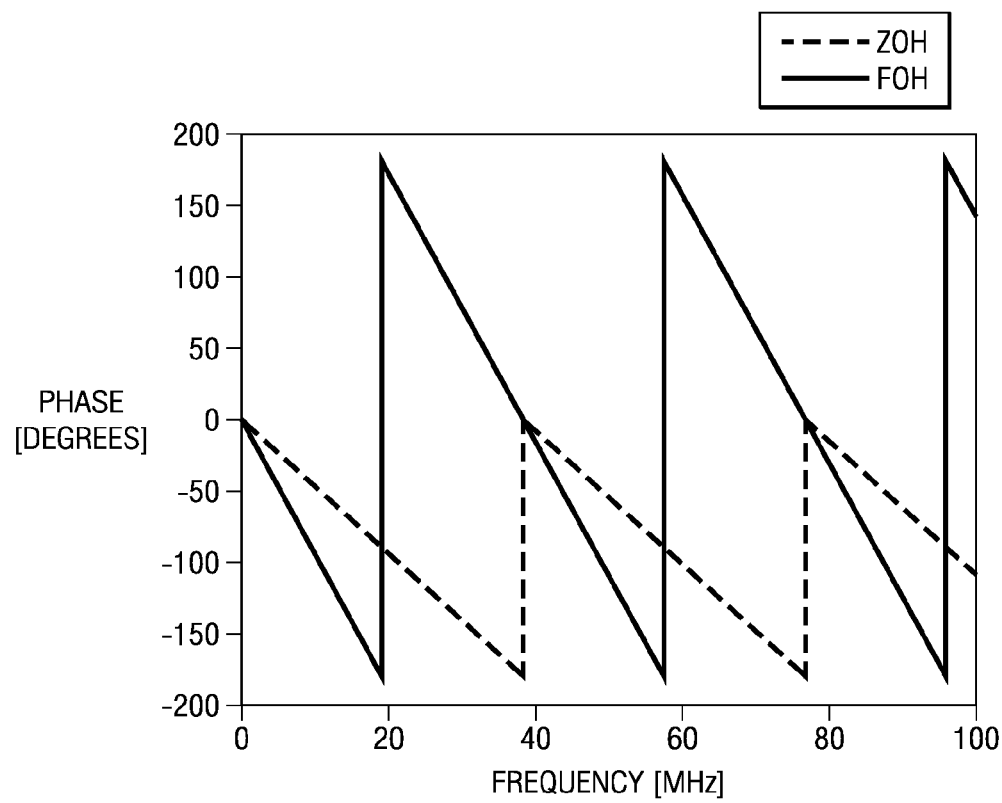

FIG. 9A is a magnitude response plot and FIG. 9B is a phase response plot for the zero-order hold (ZOH) 254 and first-order hold (FOH) 256 resamplers of the iADPLL of FIG.

2. The resampling operation in a closed loop control system such as the iADPLL, designed with a focus on cellular RF systems is challenging as sophisticated higher-order interpolation schemes can become very expensive to implement. On the other hand, a control system utilizing a resampler essentially becomes a multi-rate system, whose mathematical analysis is quite complicated. Therefore, for the iADPLL design, different resampling schemes were carefully analyzed and it was determined that due to very heavy filtering in the iADPLL loop filter, linear resampling (or FOH) is adequate for the iADPLL phase domain resampling. FIG. 9A shows the frequency response of both the ZOH 254 and the FOH 256 resamplers for a data injection rate of FREF (38.4 MHz in this case). The FOH has been implemented as a symmetric delayed interpolator with its co-efficient $\eta=\frac{1}{2}$. It can be seen that the FOH provides much more in-band filtering as compared to ZOH. The 3-dB cut-off frequency for ZOH is approx 17 MHz, while for FOH, it is approx 12 MHz. This reduces the possible impact of any aliasing that might be present in the iADPLL phase error due to the many noise sources that can potentially contaminate the DCO spectrum, such as the processor clock, current spikes in the power management system, etc. Moreover the minimum rejection above FREF is −13.26 dB for ZOH and −26.5 dB for FOH. Please, note that the IIR filters which are a part of the iADPLL loop filter are typically set in the range of 1-2 MHz, therefore for a spectral offset of 10 MHz, the phase error noise gets suppressed by 18.3 dB for ZOH and 19.5 dB for FOH, while the in-band aliased noise will be only 12 dB down for ZOH>24 dB lower for FOH.

Resampling of the Reference Feed Modulation

In this two point modulation scheme, the reference modulation input is the phase modulation compensation input, i.e., the reference modulation input cancels the phase modulation in the DCO output being feedback to the phase detector. Recall that the DCO was modulated using the direct point input. The reference modulation FCW is received from the DTX 250 at the LO-derived clock rate and needs to be resampled to the FREF domain at which the frequency/phase detector of the iADPLL operates, see FIG. 2. After careful analysis and to preserve area, it was deemed adequate that ZOH resampling is adequate on the FCW signal.

In various embodiments, two different ZOH implementations may be used. In option I, the resampling is done in the phase domain, the impact of differentiation (which is a high-pass filter to convert phase to frequency) is evident in the output spectrum. This can be problematic in case the phase modulation has tonal content, which may get amplified. Therefore option II, in which the ZOH resampling 254 takes place after differentiation 252 was adopted for the present embodiment. In this case the resampler output spectrum is flat. Note that use of ZOH at the reference modulation input introduces some aliasing. Note that the iADPLL variable phase accumulation also integrates the DCO variable phase over a period of reference frequency, which also produces aliasing in the feedback to the phase detector. The two aliased signals cancel each other substantially up to Fref/2, beyond which the residual aliasing is below the sensitivity floor for the iADPLL and gets attenuated by the phase error signal processing of the iADPLL.

Resampling of the iADPLL Phase Error

Figure 10A:
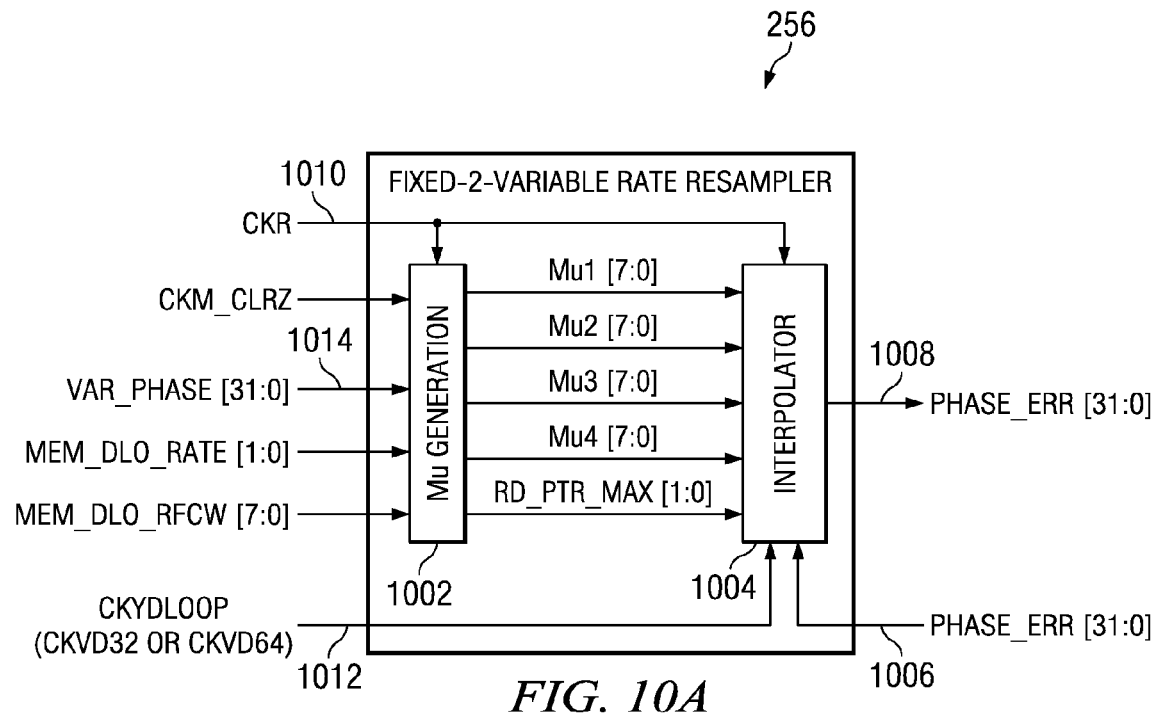
FIG. 10A is a simple block diagram and FIG. 10B is a more detailed schematic of the phase error resampler of FIG. 2.
Figure 10C:
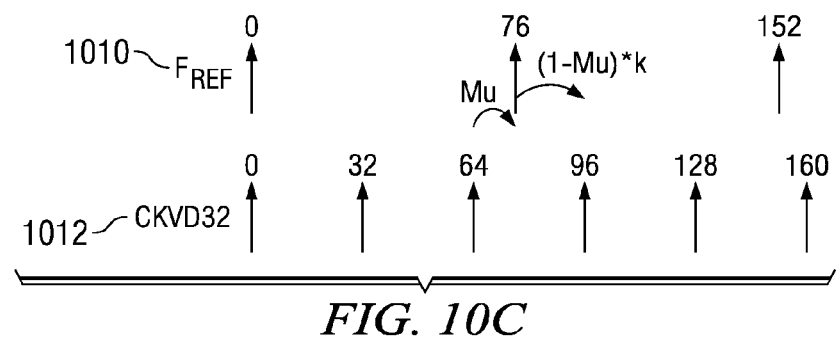
FIG. 10C illustrates Mu generation between CKVD32 and FREF in the resampler of FIG. 10A.
Figure 10B:
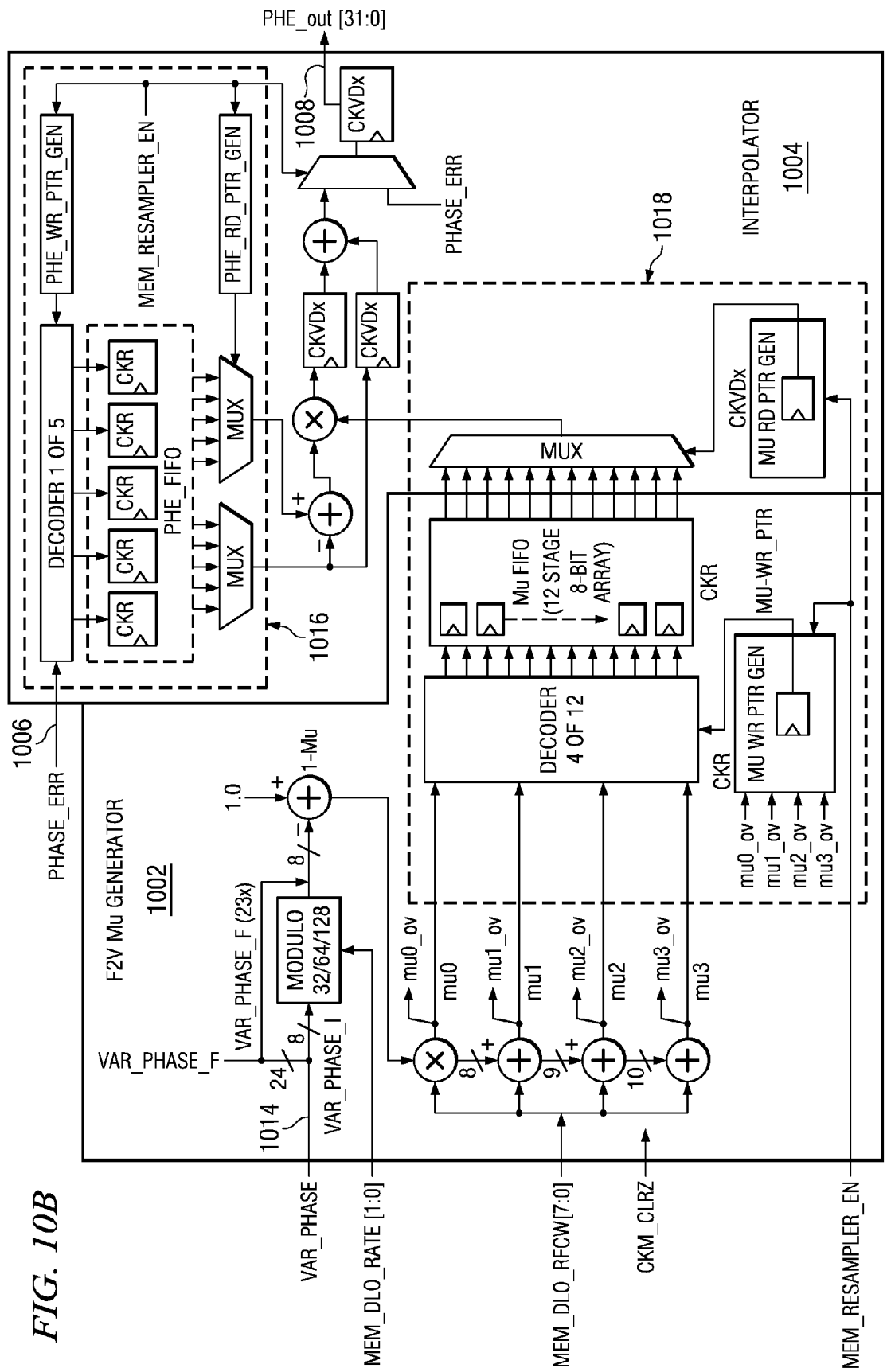

FIG. 10A is a simple block diagram and FIG. 10B is a more detailed schematic of phase error resampler 256 of FIG. 2. The frequency error detector and the phase error accumulator operate on fixed rate retimed reference clock i.e. CKR. The iADPLL loop filter 222 operates on an LO-derived clock domain, ie CKV. Therefore, the phase error needs to be resampled from this fixed rate clock domain into an RF-derived variable rate clock domain (CKV) before it is sent to the digital loop filter. The iADPLL output carries phase modulation in a polar TX. Phase resampler 256 helps to accomplish this functionality by using PLL variable phase information. Variable phase signals 1014 from the PLL carries the phase relationship information between the reference clock FREF and variable clock CKV. In Mu generator 1002, this information is used to calculate Mu values required for interpolating the phase error to a higher frequency variable rate clock, as illustrated in FIG. 10C.

The phase resampler performs $1^{st}$ order linear interpolation on phase error signal 1006 in interpolator 1004. The phase error resampler is implemented using a pair of FIFO's 1016, 1018 to correctly interpolate phase error from fixed rate reference clock (CKR) 1010 to RF derived variable rate clock (CKVDx) 1012. FIFO depth is set appropriately to support multiple variable rate clock domains for LOOP_FILTER blocks of CKV/32, CKV/64, CKV/128 and also to support any reference clock frequency between 8 MHz and 38.4 MHz. Using FIFO's also eliminates the effects of CKR jitter on iADPLL performance.

MEM_DLO_RATE is set according to the desired division factor of the variable rate clock frequency for the LOOP_FILTER blocks. MEM_DLO_RFCW is a normalization which needs to be calculated and set for the resampler to correctly calculate Mu values, based on the measured variable phase. This is a fractional value which represents the ratio between the divide factor of loop filter clock rate from CKV and FCW. For example, for a division factor of 32, this value will be 32/FCW.

This linear interpolation resampler can be configured to operate as a zero order hold resampler by setting MEM_RESAMPLER_EN=0.

When the spectrum of phase error carries a tone, resampling using a ZOH resampler may result in spectral regrowth. This spectral regrowth will be somewhat mitigated by the IIR filters in the higher-order iADPLL loop filter. However, as mentioned above, the cumulative attenuation using ZOH is approximately 13 dB less than FOH. On the contrary, using FOH for phase error resampling there is no spectral regrowth for the same input signal. Moreover the phase error noise also gets more attenuation in this mode. Note that after resampling of the PHE, the sampling frequency (or rate) for the signal gets translated to an RF-derived clock domain. Since PHE signal was originally accumulated at the FREF (or CKR) rate, its magnitude needs to be appropriately adjusted for the change of sampling rate. An explicit scaling to this effect is avoided in the resampler to save area. This scaling is incorporated later into the proportional and integral gain coefficients of the PI controller in the iADPLL.

Figure 11A:
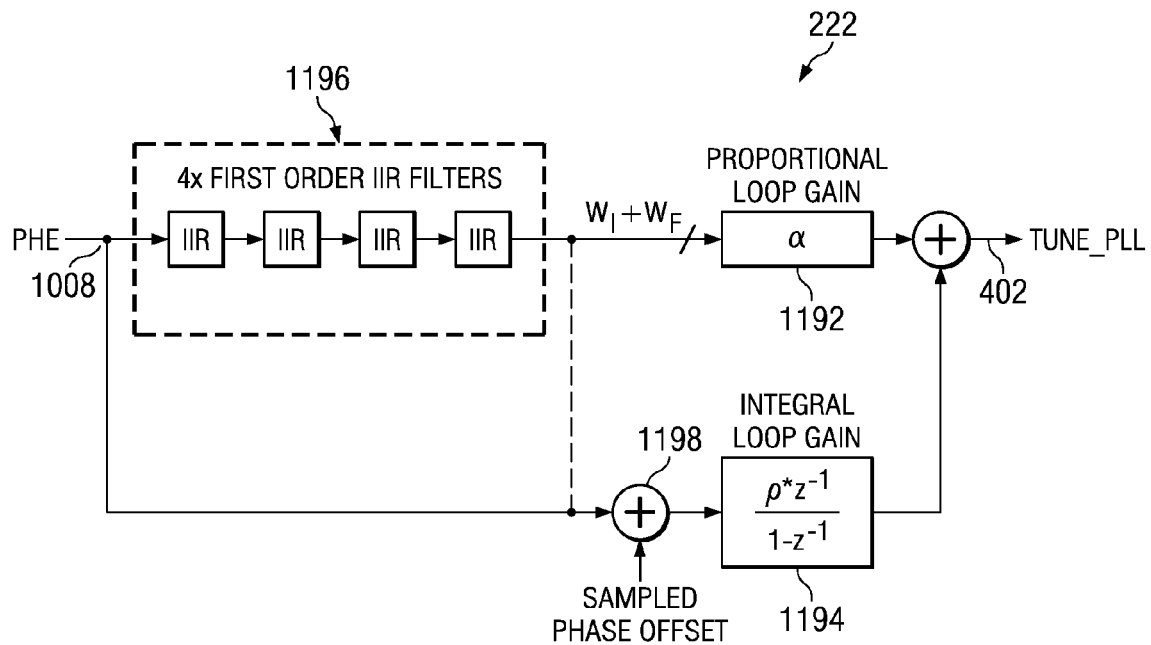
FIG. 11A is a block diagram of the loop filter for the iADPLL of FIG. 2.

FIG. 11A is a block diagram of loop filter 222 for the iADPLL of FIG. 2. The Loop Filter's main input is the PHASE_ERR signal 1008 output from the RESAMPLER block 256. Its main function is to first filter the phase error signal and then feed the filtered phase error signal to the proportional-integral controller (equivalent of type-II operation in an analog PLL) of the DCO. Note that the applied proportional and integral gains include DCO gain normalization for each of the DCO capacitor banks. The loop filter outputs TUNE_PLL, which is the tuning word contribution due to the PLL. This is added (not shown on FIG. 11, but shown on FIG. 2 by adder 224) with TUNE_TX (the feed-forward modulation injection) in the DCO interface (DCOIF) block to produce the composite OTW word (as shown in FIG. 2).

The proportional part 1192 of the iADPLL loop has a gain alpha, which is used in both type-I (used for the DCO PVT and Acquisition bank tuning) and type-II (used for DCO tracking bank tuning) operational modes of iADPLL. iADPLL can have different programmable alpha coefficients that can be used based on the operational mode.

The four IIR filters 1196 exist to filter the noisy PHASE_ERR signal. All four IIR stages are similar with following first-order transfer function:

$$y[n]=2^{-\lambda}*x[n]+(1-2^{-\lambda})*y[n-1] \quad (8)$$

where lambda is a programmable value and can take any value from 0 to 7.

The integral loop 1194 is intended to only work in tracking mode once the proportional loop is already quite close to the desired channel frequency. This is followed to minimize the overall settling time of iADPLL, otherwise, there is no hardware limitations forcing this to only be used during tracking. By adding an integrator to the loop, the loop will work to zero out the phase error. To prevent this long settling, the integral loop samples the current IIR filtered PHASE_ERR and uses the result to subtract 1198 from subsequent phase error samples. This results in a new offset error signal that can be forced to zero deviation by the integral control. The offset error value is then accumulated by the digital integrator and multiplied by the integral gain, rho, before it is added to the proportional correction.

Figure 11B:
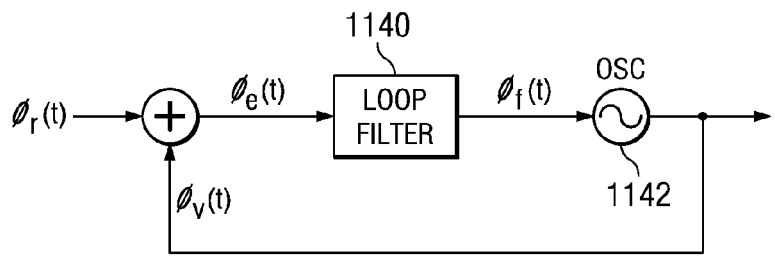
FIG. 11B represents a simple model of the loop filter to illustrate various dynamic operating possibilities.

FIG. 11B represents a simple model of the loop filter to illustrate various dynamic operating possibilities. Filter 1140 represents embodiments of filter 222. Oscillator 1142 represents oscillator 228. Two cases will be described: 1) a simple proportional-integral (PI) filter, and 2) a PI filter preceded by a set of infinite impulse response (IIR) filters. To compute the dependence of the PLL dynamics on the loop filter parameters, equation 1 represents the general operation of filter 1140:

$$\phi_e(t)=\phi_r(t)-\phi_v(t) \quad (9)$$

Case I

For the case of a type-II PLL, when the loop filter 1140 is a simple PI controller, the filtered phase error $\phi_f(t)$ is given by $$\phi_f(t) = \alpha\phi_e(t) + \rho \int_t \phi_e(\tau)d\tau \quad (10)$$

where $\alpha$ and $\rho$ are the proportional and integral gains of the controller In frequency domain, the loop filter transfer function is $$H(s) = \frac{\phi_F(s)}{\phi_E(s)} = \alpha + \frac{\rho}{s} \quad (11)$$

With the oscillator 1142 being represented by a simple integrator, i.e., $$O(s) = \frac{1}{s},$$

we can write the PLL transfer function as $$G(s) = \frac{H(s)O(s)}{1+H(s)O(s)} \quad (12)$$

$$= \frac{\left(\alpha + \frac{\rho}{s}\right) \cdot \frac{1}{s}}{1 + \left(\alpha + \frac{\rho}{s}\right) \cdot \frac{1}{s}}$$

$$= \frac{s\alpha + \rho}{s^2 + s\alpha + \rho}$$

Comparing the dominator with a generic $2^{nd}$ order system transfer function, we have $$s^2+s\alpha+\rho==s^2+2\zeta\omega_n s+\omega_n^2$$

Comparing co-efficients, we get $$2\zeta\omega_n=\alpha$$

$$\omega_n^2=\rho \quad (13)$$

and simplifying the relations along with the standard relation for frequency response of a $2^{nd}$ order system $$\omega=\omega_n\sqrt{1-\zeta^2} \quad (14)$$

we have $$\omega_n = \sqrt{\rho} \quad (15)$$

$$\zeta = \frac{\alpha}{2 \cdot \sqrt{\rho}}$$

$$\omega = \sqrt{\rho - \frac{\alpha^2}{4}}$$

Therefore, for the simple PLL, the settling time of the system is given by $$t_s = \frac{4}{\zeta\omega_n} = \frac{8}{\alpha} \quad (16)$$

It is evident from (15) and (16) that the key ADPLL parameters such as the damped frequency response, loop bandwidth and phase margin are a function of both PI controller parameters.

Case II

For the case of a type-II PLL, when the loop filter comprises a set of filters followed by a PI controller, as illustrated in 11A, The z-domain transfer function of the ADPLL loop filter 222 is given by $$H(z) = \alpha F(z) + \frac{\rho z^{-1}}{1 - z^{-1}} \quad (17)$$

where $\alpha$ and $\rho$ are the proportional and integral gains of the controller and F(z) is the transfer function of the IIR filters given by $$F(z) = \prod_{i=0}^{3} \frac{\lambda_i}{1+(1-\lambda_i)z^{-1}} \quad (18)$$

In s-domain, the corresponding loop filter transfer function is $$H(s) = \frac{\phi_F(s)}{\phi_E(s)} = \alpha F(s) + \frac{\rho}{s} \quad (19)$$

where F(s) is the s-domain equivalent transfer function of the IIR filters. Therefore, the ADPLL transfer function becomes $$G(s) = \frac{s\alpha F(s) + \rho}{s^2 + s\alpha F(s) + \rho} \quad (20)$$

Comparing the denominator with a generic $2^{nd}$ order system transfer function, we have $$s^2 + s\alpha F(s) + \rho = s^2 + 2\zeta\omega_n s + \omega_n^2$$

Comparing coefficients, and simplifying we get the following relations for the ADPLL dynamics $$\omega_n = \sqrt{\rho} \quad (21)$$
$$\zeta = \frac{\alpha F(s)}{2 \cdot \sqrt{\rho}}$$
$$\omega = \sqrt{\rho - \frac{\alpha^2 F(s)^2}{4}}$$

Therefore, for the simple PLL, the settling time of the system is given by $$t_s = \frac{4}{\zeta\omega_n} = \frac{8}{\alpha F(s)} \quad (22)$$

Therefore the damping factor $\zeta$ (and hence the phase margin) and the damped frequency response $\omega$ of the PLL are a function of the PI gain control parameters as well as the transfer function of the filters preceding the proportional gain block.

Figure 12A:
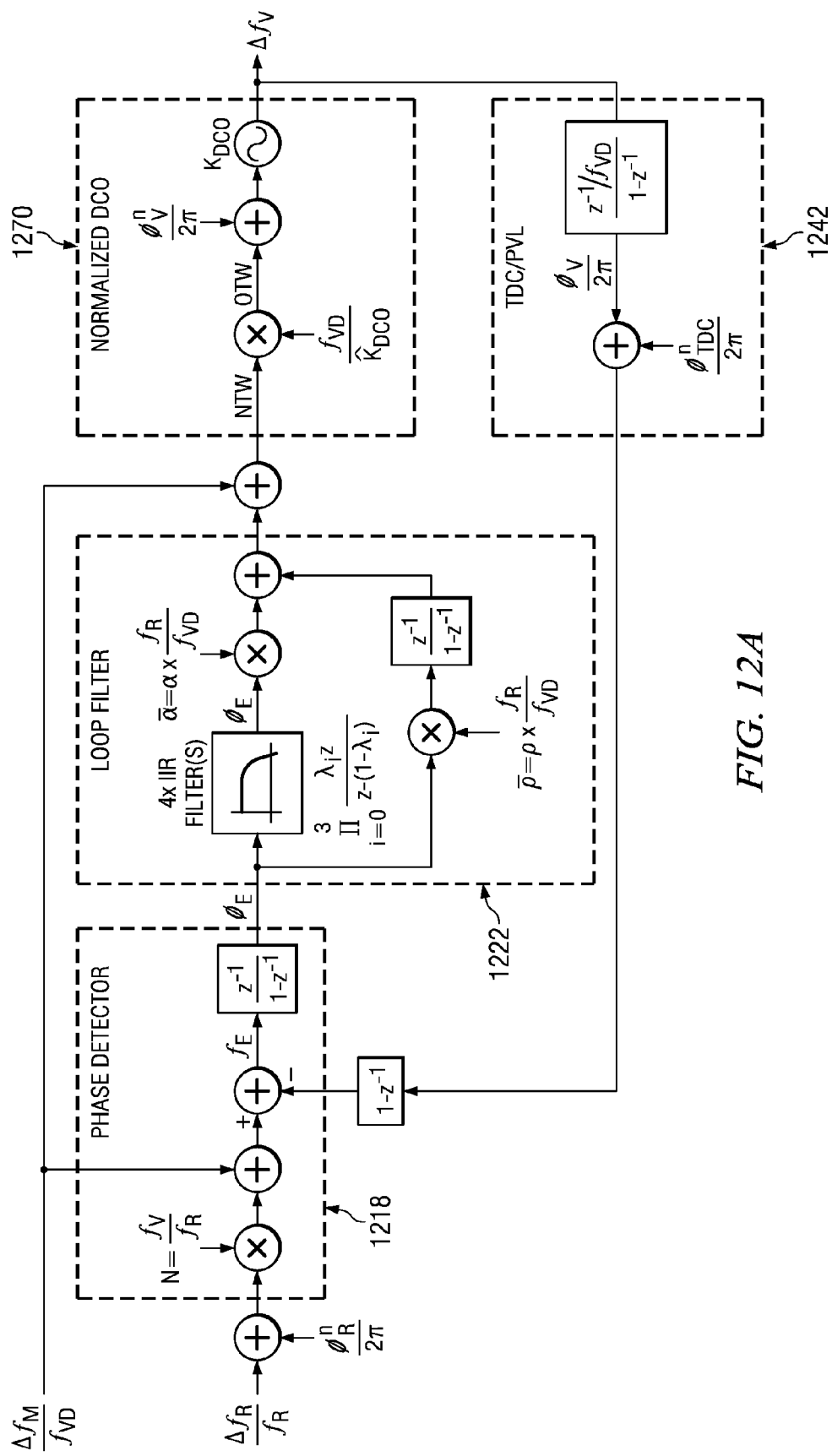
FIG. 12A is a z-domain block diagram for the iADPLL with all iADPLL operations shown at $f_{VD}$.

FIG. 12A shows a z-domain, frequency mode model of the iADPLL, i.e., the input and the output of the iADPLL are in terms of frequency units. The model includes phase detector module 1218, loop filter module 1222, normalized DCO module 1270 and feedback TDC/PVL module 1242. The loop filter 1222 for iADPLL comprises four independently controlled IIR stages and a proportional-integral (PI) controller. Eq. (23) is a linearized z-domain model that includes the four cascaded single-stage IIR filters, each with an attenuation factor $\lambda_i$, where i=0 . . . 3 as well as the proportional and integral parts of the loop. The loop filter operates at the $f_{VD} = f_v/32$ rate, where $f_v$ is the DCO output frequency.

$$H_{loop}(z) = \bar{\alpha} \cdot \prod_{i=0}^{3} \frac{\lambda_i}{1+(1-\lambda_i)z^{-1}} + \bar{\rho} \cdot \frac{z^{-1}}{1-z^{-1}} \quad (23)$$

Figure 12B:
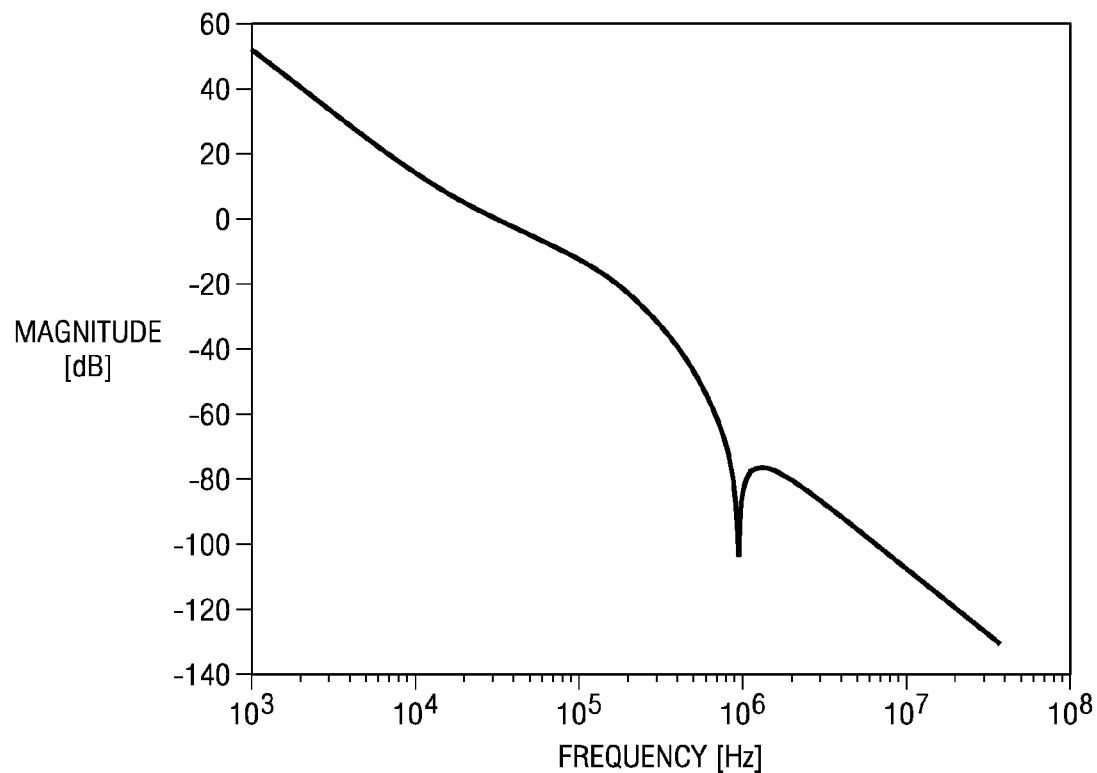
FIGS. 12B and 12C are plots of z-domain phase response with open-loop amplitude and phase transfer functions of the iADPLL of FIG. 12A with default loop settings, $\alpha=2^{-7}$, $\rho=2^{-16}$, $\lambda=[2^{-3}\ 2^{-5}\ 2^{-5}\ 2^{-5}]$ and integral gain operating on resampled PHE signal.
Figure 12C:
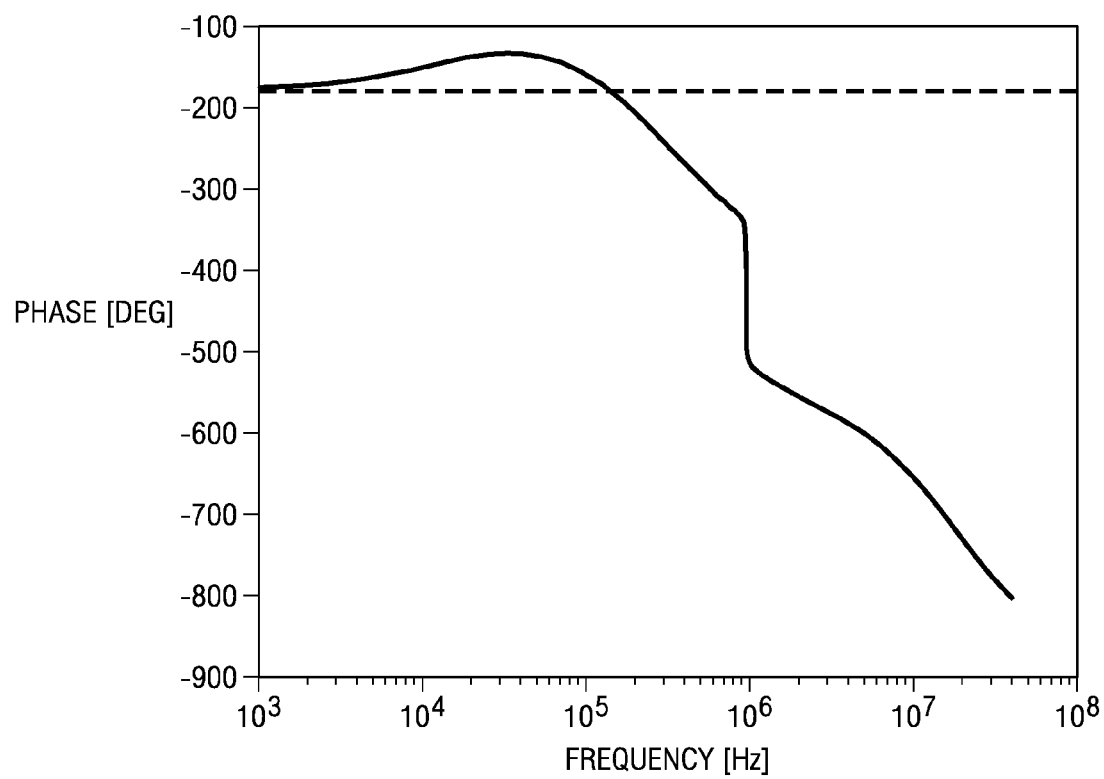

FIGS. 12B and 12C are open-loop amplitude and phase transfer functions of the iADPLL of FIG. 12A with default loop settings, $\alpha=2^{-7}, \rho=2^{-16}, \lambda=[2^{-3}\ 2^{-5}\ 2^{-5}\ 2^{-5}]$ and integral gain operating on resampled PHE signal.

Alternately, iADPLL also supports a mode in which the integral part of the PI controller also operates on filtered phase error computed by operating a set of cascaded IIR filters on the resampled PHE signal. The main advantage of this mode is that as the integral part operates on an error signal, which has undergone low pass filtering after resampling (identical to the proportional part) resulting in better group delay equalization of the two paths. Note that in this mode the phase margin of the iADPLL under similar conditions will be sacrificed. In this mode, the loop filter can be expressed as follows:

$$H_{loop}(z) = \left(\bar{\alpha} + \bar{\rho} \cdot \frac{z^{-1}}{1-z^{-1}}\right) \cdot \prod_{i=0}^{3} \frac{\lambda_i}{1+(1-\lambda_i)z^{-1}} \quad (24)$$

Note that the coefficients $\alpha$ (alpha) and $\rho$ (rho) control the overall gain of filter 1222. Operation of these two coefficients will be described in more detail below.

Figure 12D:
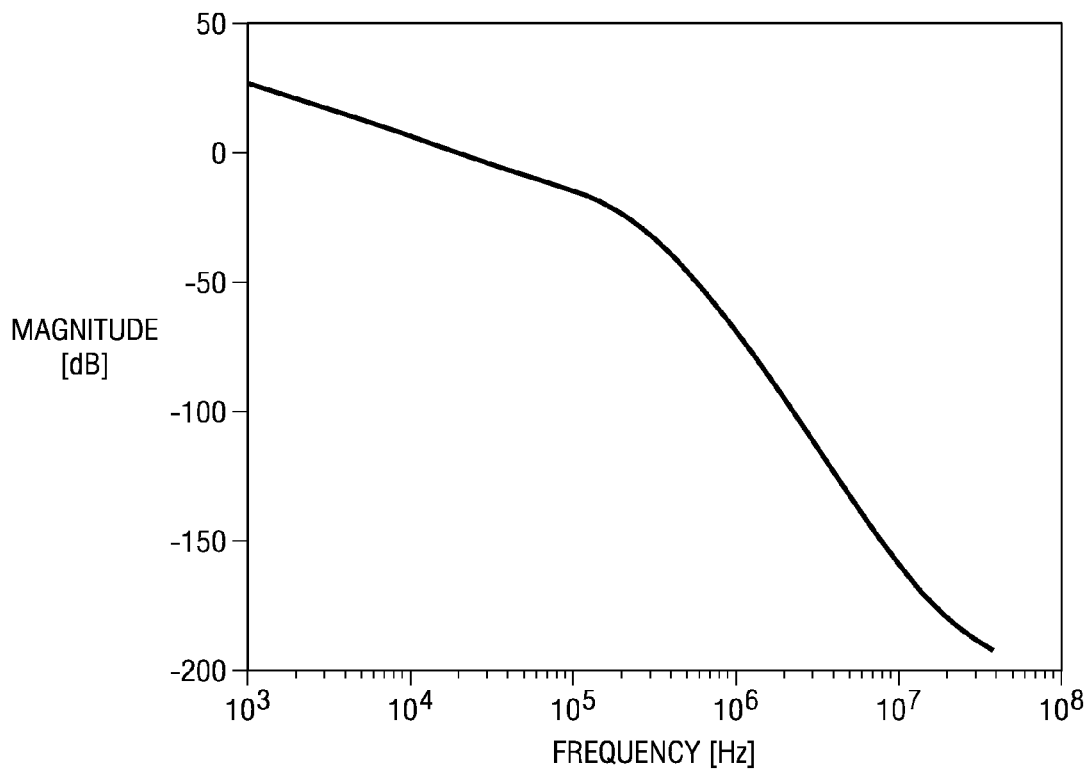
FIGS. 12D and 12E are plots of z-domain phase response with open-loop amplitude and phase transfer functions of the iADPLL of FIG. 12A with default loop settings, $\alpha=2^{-7}$, $\rho=2^{-16}$, $\lambda=[2^{-3}\ 2^{-5}\ 2^{-5}\ 2^{-5}]$ and integral gain operating on filtered PHE signal.
Figure 12E:
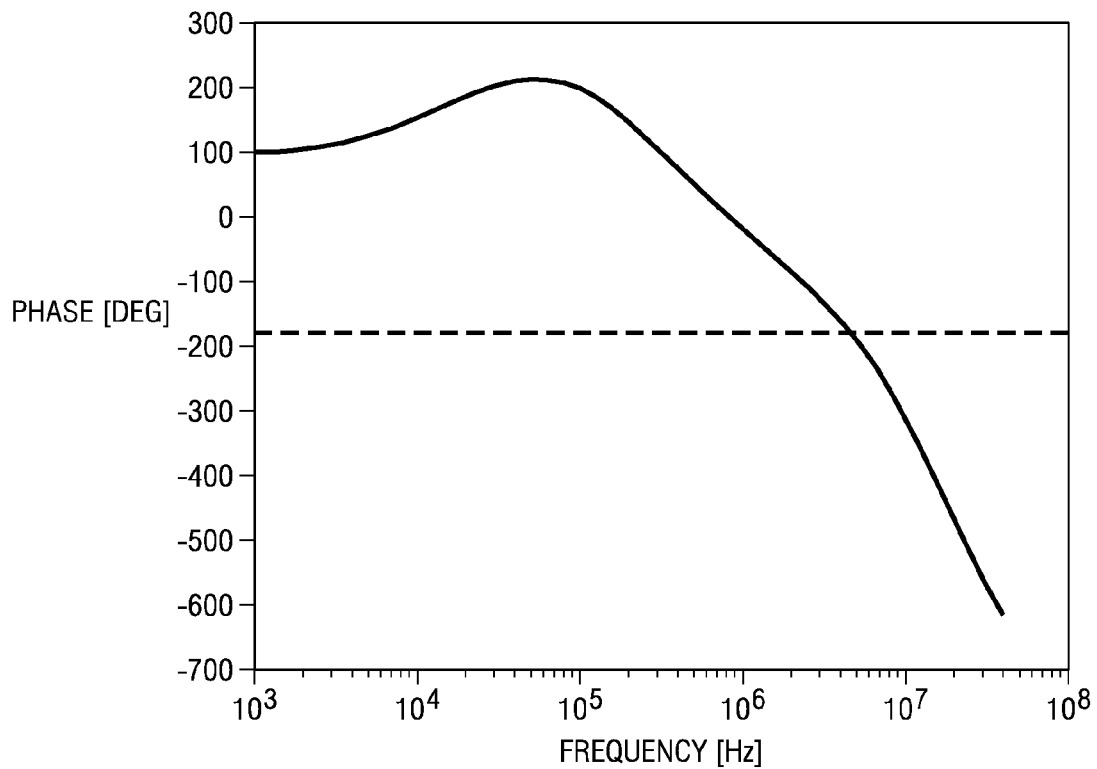

FIGS. 12D and 12E are plots of z-domain phase response with open-loop amplitude and phase transfer functions of the iADPLL of FIG. 12A with default loop settings, $\alpha=2^{-7}$, $\rho=2^{-16}, \lambda=[2^{-3}\ 2^{-5}\ 2^{-5}\ 2^{-5}]$ and integral gain operating on filter PHE signal.

$$\frac{\phi_R^n}{2\pi}, \frac{\phi_V^n}{2\pi} \text{ and } \frac{\phi_{TDC}^n}{2\pi}$$

are the reference, variable (DCO) and the TDC error source contributions, respectively. For simplicity, the feed-forward path comprises of the DCO represented only as the frequency scaling factor $K_{DCO}$. For simplicity, the phase accumulation of the DCO has been modeled as a discrete integrator running at $f_{VD}$ rate in the feedback path. Note that the DCO integration can also be represented using the Bilinear/Tustin transformation. This is equivalent to running the DCO at the $f_V$ rate and then scaling the phase accumulation at the output to the $f_{VD}$ rate.

$$H_{DCO}(z) = \frac{z^{-1}}{1-z^{-1}} \cdot \frac{1}{t_{VD}} \quad (25)$$

The simplified feed-forward transfer function of the loop is $$H_{FF}(z) = \frac{z^{-1}}{1-z^{-1}} \cdot \left(\bar{\alpha} \cdot \prod_{i=0}^{3} \frac{\lambda_i}{1+(1-\lambda_i)z^{-1}} + \bar{\rho} \cdot \frac{z^{-1}}{1-z^{-1}}\right) \cdot \frac{f_{VD}}{f_R} \cdot r \quad (26)$$

where r is the dimensionless ratio representing the DCO gain estimation error.

The transfer function of the feedback components is $$H_{FB}(z) = \frac{z^{-1}}{1-z^{-1}} \cdot \frac{1}{f_{VD}} \cdot 1 - z^{-1} = \frac{z^{-1}}{f_{VD}} \quad (27)$$

The closed loop transfer function for the reference is lowpass with the gain multiplier N=FCW, i.e., $$H_{cl,REF}(z) = N \cdot \frac{H_{FF}(z)}{1 + H_{FF}(z) \cdot H_{FB}(z)} \quad (28)$$

The closed loop transfer function for the TDC is lowpass. Neglecting the accumulation and the differentiation operations in the feedback path, we can write the closed-loop transfer function for TDC as $$H_{cl,TDC}(z) = \frac{H_{FF}(z)}{1 + H_{FF}(z)} \quad (29)$$

The closed loop transfer function for the direct-point injection into the DCO is highpass in nature and is given by $$H_{cl,DCO}(z) = \frac{1}{1 + H_{FF}(z) \cdot H_{FB}(z)} \quad (30)$$

Figure 12F:
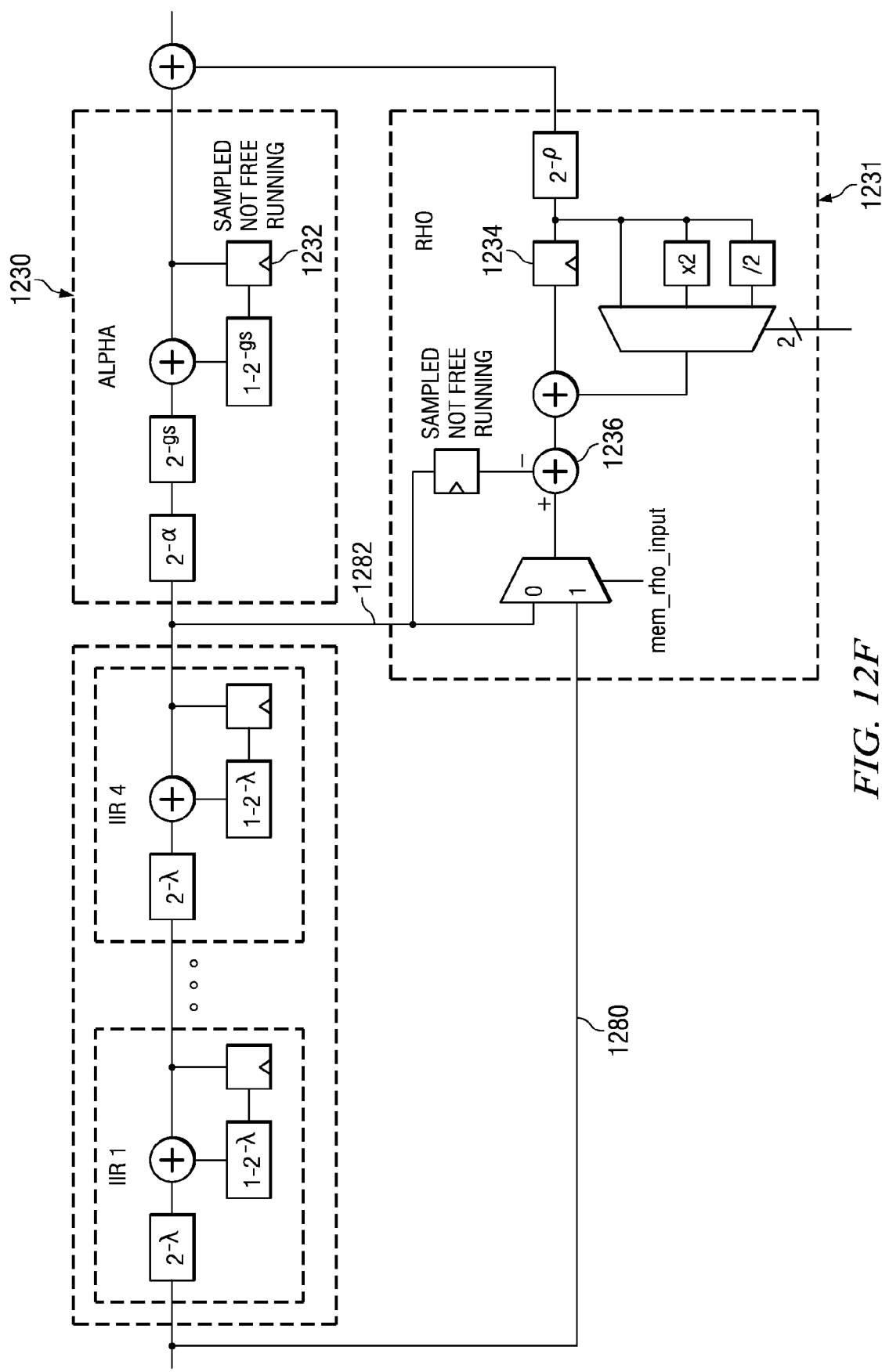
FIG. 12F is a block diagram of the iADPLL loop filter with alpha gear-shifting.
Figure 12G:
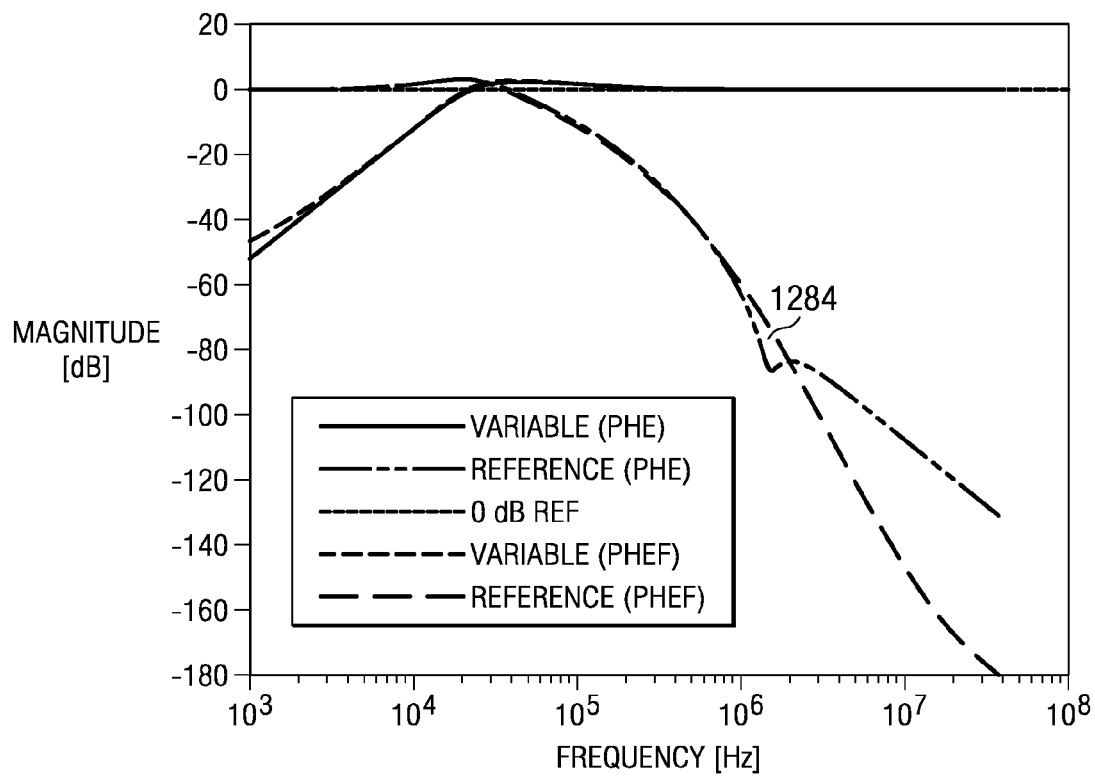
FIG. 12G is a plot showing the closed loop iADPLL transfer function magnitude response using both a raw PHE signal and a filtered PHEF signal for integral control.
Figure 12H:
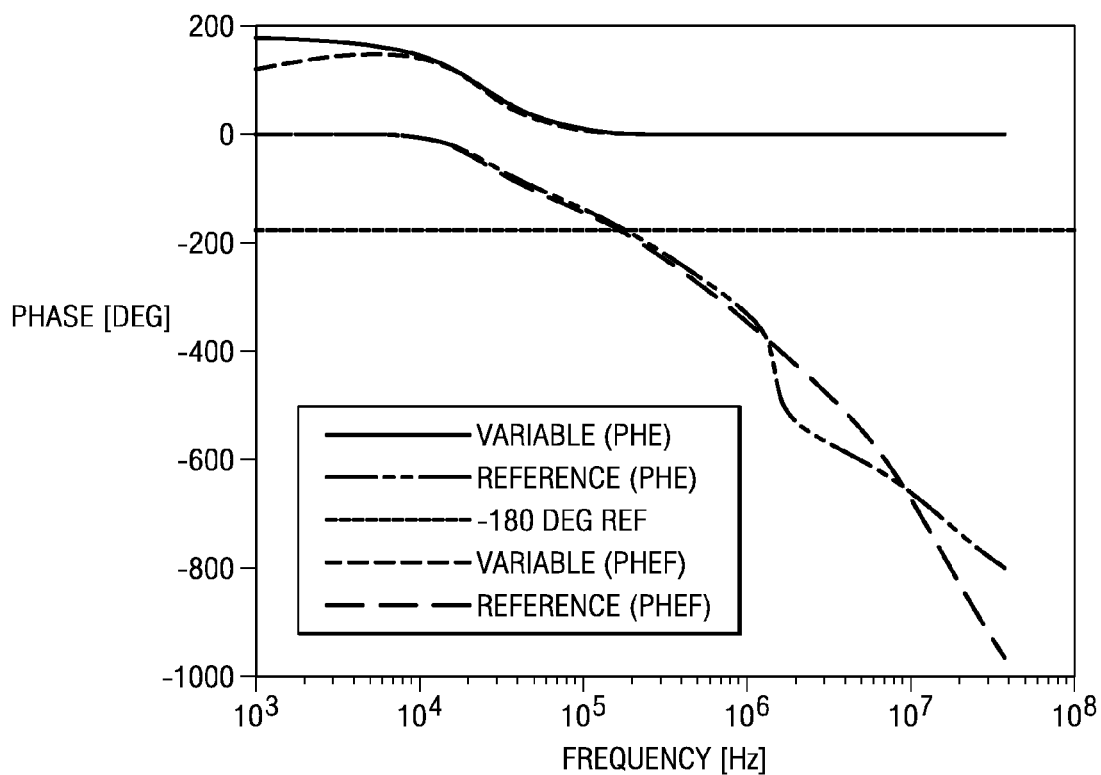
FIG. 12H is a plot showing the closed loop iADPLL transfer function phase response using both a raw PHE signal and a filtered PHEF signal for integral control.

FIG. 12F is a block diagram of the iADPLL loop filter 1222 with proportional (alpha) gear-shifting circuit 1230 and integral (rho) gear shifting circuit 1231. The amplitude and phase transfer function differences using the iADPLL loop filters in the configurations as captured in Eq. 23 and 24, also see FIGS. 12B-12E, impacts the ADPLL closed loop performance as well. FIG. 12G is a plot showing the closed loop iADPLL transfer function magnitude response when using a raw PHE signal 1280 for integral control, and when using a filtered PHEF signal 1282 for integral control. FIG. 12H is a plot showing the closed loop iADPLL transfer function phase response using both a raw PHE signal and a filtered PHEF signal for integral control.

Essentially the use of filtered phase error for the integral control part of the iADPLL loop filter eliminates the amplitude and phase transfer function abruption (introduced due to resampling in raw PHE signal). However, note that physically the kink 1284 shown in the reference iADPLL transfer function is 80 dB below the PLL unity gain and as such does not produce any stability concerns for iADPLL loop bandwidth extending up to a few hundreds of kilohertz. Note, that under typical operating conditions, iADPLL loop bandwidth will be in the range of 20-60 kHz only.

Note that all the transfer functions are a function of the DCO frequency $f_V$ or its derivatives, such as CKVDx The primary advantage of operating the iADPLL on the $f_{VD}$ frequency is the improved spectrum and better rejection of the reference spurs. However, this results in the iADPLL loop response to vary as a function of DCO frequency for fixed iADPLL tuning parameters. Although this iADPLL BW variation is quite small, it can be taken care of by optimal tuning of the iADPLL loop parameters as a function of the DCO output frequency. Note that for the entire GSM/EDGE tuning range this variation is less than 4% of PLL BW and less than 2% of the iADPLL phase margin.

Some operating points computed for GSM modulation using the model presented in equations 23~30 are shown in Table 2.

TABLE 2 iADPLL Loop Parameters - Channel Frequency = 1800 MHz

| lambda1 | lambda2 | lambda3 | lambda4 | alpha | rho | 0 dB loop BW [kHz] | Gain Margin [dB] | Phase Margin [deg] | 50 kHz Loop Gain [dB] | 400 kHz Loop Gain [dB] | 3 MHz Loop Gain [dB] |
|---|---|---|---|---|---|---|---|---|---|---|---|
| 4 | 6 | 6 | 6 | 8 | 18 | 15.57 | 17.64 | 45.00 | −10.22 | −66.53 | −98.31 |
| 2 | 4 | 4 | 6 | 7 | 16 | 30.89 | 20.28 | 45.23 | −2.04 | −36.02 | −87.14 |
| 5 | 6 | 2 | 0 | 7 | 16 | 30.87 | 21.09 | 45.05 | −2.06 | −36.92 | −93.12 |
| 3 | 5 | 5 | 5 | 7 | 16 | 31.15 | 17.38 | 44.81 | −1.70 | −38.27 | −86.31 |
| 1 | 5 | 6 | 6 | 6 | 19 | 44.16 | 9.96 | 45.48 | 2.53 | −41.59 | −106.55 |
| 1 | 3 | 4 | 6 | 6 | 15 | 54.24 | 16.68 | 45.30 | 2.60 | −28.40 | −85.65 |
| 3 | 3 | 5 | 0 | 6 | 14 | 61.66 | 20.02 | 45.10 | 3.36 | −21.80 | −86.01 |
| 2 | 3 | 3 | 6 | 5 | 16 | 85.54 | 13.29 | 45.48 | 1.35 | −21.81 | −78.03 |
| 2 | 3 | 4 | 4 | 5 | 13 | 110.90 | 12.56 | 44.72 | 2.27 | −13.40 | −72.09 |
| 2 | 2 | 3 | 3 | 5 | 12 | 124.06 | 16.51 | 44.76 | 2.24 | −9.71 | −57.03 |

Proportional and Integral Gain Gear Shifting

An important issue in frequency synthesis for today's wireless applications is the acquisition or settling time to a new channel frequency from the trigger event to the instance when the wireless terminal is ready to transmit or receive with the specified low level of frequency error, phase noise and spurious tones.

The gain of iADPLL control loop requires special settings for different modes of operation. Gear shifting changes the gain of the control loop to suit the various operating modes. For example, it is desirable to have high loop bandwidth while initially locking in acquisition mode in order that the PLL settle quickly. In tracking mode, however, it is desirable to have a low loop bandwidth to increase the performance of the PLL. Increasing the loop gain widens the bandwidth of the loop while decreasing the loop gain narrows the loop bandwidth.

Both the proportional and integral loops have the capability to change their bandwidths via gear shifting. The proportional loop is controlled by coefficient α (alpha), while the integral loop is controlled by coefficient ρ (rho) When a gear shift happens, the gear shift value increments (or decrements) the corresponding gain. A gear shift mechanism is described in US Patent Publication N. 2007-0085622 entitled "CONTINUOUS REVERSIBLE GEAR SHIFTING MECHANISM" and which is incorporated by reference herein in its entirety.

Both alpha and rho together affect the bandwidth or more particularly, frequency response, of the iADPLL. In the IIR gear shift block, the IIR filter is unity gain Unity gain is defined as a gain of linear 1 or 0 dB at DC when clocked continuously. The lambda ($\lambda$) coefficients, however, can be changed without negative implications to the operation of the gear shift mechanism or loop performance With reference to the proportional alpha gear shift mechanism 1230, alpha and gain (g) are multiplied together to provide an effective alpha. The gear shifting is effected in this manner whereby the feed forward gain is changed without generating a DC perturbation to the system.

With reference to the integral rho gear shift block 1231, register 1234 and adder 1236 function as an integrator to accumulate the ρ gain. The ρ gear shift is operative to accumulate the phase error and multiply the result by the value rho. This changes the dynamics of the loop from type-I to type-II operation. A type-I is an integrator-free system (the only integrator would be the DCO) wherein loop operation is proportional. A type-II loop has an integrator in its loop. A type-I loop is used when faster loop settling is desired and type-II loop is used when better noise performance is desired, especially removal of the DCO flicker noise.

When operating in a type I loop, the alpha gear shifting is sufficient since the integral portion (i.e. the rho gear shift) is not active. When the loop moves to type II operation, both the alpha and the rho coefficient values must be changed simultaneously to effect a gear shifting of the loop bandwidth without substantially changing the frequency response shape (only scaling would be preferred) and without negatively affecting the loop stability, such as gain or phase margins, or damping factor for type-II second-order systems.

For the dynamic proportional gain gear-shifting, the feedback register 1232 needs to sample a new value for the feedback path. Gear shifting can occur during any of the iADPLL operational modes; however, it is only sensible during tracking. Although the iADPLL loop bandwidth can be adjusted independently using either proportional (coarse change) or integral (finer change) gains, the possibility to simultaneously gear-shift both alpha and rho allows the iADPLL loop bandwidth to change while maintaining the phase and stability margins for the loop.

Gear-shifting a PLL implies a dynamically change of the PLL loop parameters such as loop gain, loop bandwidth, etc. However, for an ADPLL with loop filter as described in eq. (17), the loop parameters are a function of all the loop filter components that includes the parameters for the filtering and proportional-integral regulator. Using (21), it is clear that for the specific loop filter configuration shown, the ADPLL damping ratio is directly proportional to the proportional gain $\alpha$ and the cascaded IIR filter transfer function F(s), while it is inversely proportional to the square root of the integral gain $\rho$. Therefore, if the loop parameters are to be changed while preserving the phase margin of the ADPLL, then all the forementioned parameters need to be gear-shifted (or switched) simultaneously.

A set of examples have been provided below for selective ADPLL parameter gear-shifts, that show the dependence of ADPLL loop BW and phase margin on the IIR co-efficient and PI controller gains. Please note that all the loop filter coefficients have been implemented as $2^{-n}$ coefficients, where n is as specified in the tables below, such that, if n1>n2, then $2^{-n1} < 2^{-n2}$.

Case A: Gear-Shifting of IIR Filter(s)

In the table 3, one of the IIR filter coefficients has been decremented, resulting in slight widening of the IIR filter transfer function. As expected from (21), this results in the reduction of the ADPLL loop BW, while increasing the gain and phase margin of the system.

TABLE 3

| lambda1 | lambda2 | lambda3 | lambda4 | alpha | rho | 0 dB CL BW [kHz] | Gain Margin [dB] | Phase Margin [deg] |
|---|---|---|---|---|---|---|---|---|
| 3 | 4 | 4 | 5 | 6 | 15 | 125.99 | 11.29 | 44.34 |
| 2 | 4 | 4 | 5 | 6 | 15 | 122.08 | 12.19 | 46.09 |

Case B: Gear-Shifting of PI Controller's Proportional Gain

The table 4 shows the impact of gear-shifting the proportional gain $\alpha$ down by one step. The impact is a big increase in the ADPLL loop BW, accompanied with a sharp decline in the gain and the phase margin of the system

TABLE 4

| lambda1 | lambda2 | lambda3 | lambda4 | alpha | rho | 0 dB CL BW [kHz] | Gain Margin [dB] | Phase Margin [deg] |
|---|---|---|---|---|---|---|---|---|
| 3 | 4 | 4 | 5 | 6 | 15 | 125.99 | 11.29 | 44.34 |
| 3 | 4 | 4 | 5 | 5 | 15 | 211.64 | 5.78 | 28.74 |

Case C: Gear-Shifting of PI Controller's Integral Gain

The table 5 shows the impact of gear-shifting the integral gain $\rho$ up by one step. The impact is a decrease in the ADPLL loop BW, accompanied by an increase in the gain and the phase margin of the system

TABLE 5

| lambda1 | lambda2 | lambda3 | lambda4 | alpha | rho | 0 dB CL BW [kHz] | Gain Margin [dB] | Phase Margin [deg] |
|---|---|---|---|---|---|---|---|---|
| 3 | 4 | 4 | 5 | 6 | 15 | 125.99 | 11.29 | 44.34 |
| 3 | 4 | 4 | 5 | 6 | 16 | 112.49 | 11.80 | 50.69 |

Case D: Simultaneous Gear-Shifting of the PI Controller's Proportional and Integral Gains As per eq. (15), if we neglect the contribution of the IIR filters, the ADPLL frequency damping and the damping ratio impacting the ADPLL loop BW and the phase margin is proportional to $$\frac{\alpha}{2 \cdot \sqrt{\rho}},$$

therefore, if we gear-shift α up by a factor of 2 (i.e., we gear shift α from 6 to 5, so 2^(−5)/2^(−6)=2), then correspondingly the integral gain ρ will need to be gear-shifted by 4. However, when we do so, we observe that the PLL loop BW has scaled by approximately a factor of 2 as expected, however, the phase margin did not hold and shows severe degradation as shown in Table 6.

TABLE 6

| lambda1 | lambda2 | lambda3 | lambda4 | alpha | rho | 0 dB CL BW [kHz] | Gain Margin [dB] | Phase Margin [deg] |
|---|---|---|---|---|---|---|---|---|
| 3 | 4 | 4 | 5 | 6 | 15 | 125.99 | 11.29 | 44.34 |
| 3 | 4 | 4 | 5 | 5 | 13 | 229.99 | 4.33 | 17.85 |

Case E: Two-step Gear-Shifting of the IIR and PI Controller Gains

While the above discussions suggest switching all parameters together is beneficial, it may be useful to have a gear-shifting sequence in which alpha and rho gear-shift together, while the IIRs switch separately in two steps. In this embodiment the alpha/rho are gear-shifted, while the filter coefficients may have switchable settings. Operating this way, the system can still maintain the phase margin to better than approximately 40 degrees. The dwell time on the intermediate setting (with slightly narrower loop BW) is small and does not degrade the PLL system performance. The example in Table 7 shows gear-shifting from narrow to wider loop BW and the sequence gets reversed when switching to wider loop BW.

TABLE 7

| lambda1 | lambda2 | lambda3 | lambda4 | alpha | rho | 0 dB CL BW [kHz] | Gain Margin [dB] | Phase Margin [deg] |
|---|---|---|---|---|---|---|---|---|
| 3 | 4 | 4 | 5 | 6 | 15 | 125.99 | 11.29 | 44.34 |
| 0 | 3 | 4 | 5 | 6 | 15 | 108.43 | 14.87 | 50.87 |
| 0 | 3 | 4 | 5 | 5 | 20 | 206.66 | 9.75 | 44.46 |

Case F: Simultaneous Gear-Shifting of the IIR and PI Controller Gains

Table 8 shows that if we simultaneously gear-shift the ADPLL's PI controller parameters, while switching the IIR filter coefficients, we can change the ADPLL loop BW while maintaining adequate phase margin. The possible range of gain margin decreases whenever the loop BW is increased as expected for a type-II or higher system. However, note that using the simultaneous switching of IIR filter co-efficients and PI controller parameters, the system can gear-shift between a large set of loop bandwidths, while achieving good gain and phase margins. For good operation, maintaining the bandwidth margin above about 40 degrees provides good results. Some such examples have been presented In Table 8.

TABLE 8

| lambda1 | lambda2 | lambda3 | lambda4 | alpha | rho | 0 dB CL BW [kHz] | Gain Margin [dB] | Phase Margin [deg] |
|---------|---------|---------|---------|-------|-----|------------------|------------------|--------------------|
| 3 | 4 | 4 | 5 | 6 | 15 | 125.99 | 11.29 | 44.34 |
| 0 | 3 | 4 | 5 | 5 | 20 | 206.66 | 9.75 | 44.46 |
| 2 | 4 | 4 | 6 | 7 | 16 | 61.19 | 16.58 | 44.95 |

FIG. 12J is a block diagram of another embodiment illustrative of a way to perform gear shifting in loop filter 222. Multipliers 1290 and 1292 introduce alpha and rho coefficients, respectively, into the filter process. Multipliers 1294 and 1295 insert a common $\alpha_1$ coefficient as indicated. The multipliers are advantageously realized as bit shift operators for power-of-two multiplying coefficients. The common $\alpha_1$ multiplier ensures that alpha and rho maintain the square-root relationship, which maintains the damping factor zeta, as discussed above.

FIG. 12K is a state diagram illustrating state transitions from a narrow bandwidth filter state 3002 to a wide bandwidth filter state 3004 and vice versa. ADPLL loop bandwidth (BW) switching is typically triggered in anticipation of events and/or disturbances that potentially impact the quality of the locked local oscillator clock generated by the ADPLL and the DCO system. Depending on operating conditions and current coefficient settings, the transition may be made by changing the IIR coefficients and the proportional-integral coefficients $\alpha$ and $\rho$ all simultaneously in state 3006 or state in 3016. The transition may also be made be changing only $\alpha$ and $\rho$ simultaneously in state 308 or in state 3014. In other cases, the transitions may be made by changing only the IIR coefficients in state 3010 or in state 3012. Alternatively, in some conditions the transition may be made be first changing only $\alpha$ and $\rho$ simultaneously in state 308 or in state 3014 and then jumping to state 3010 or 3012 respectively to change one or more IIR coefficients. Likewise, the transition can be made via state 3010 to state 3008 or state 3012 to state 3014.

Figure 13:
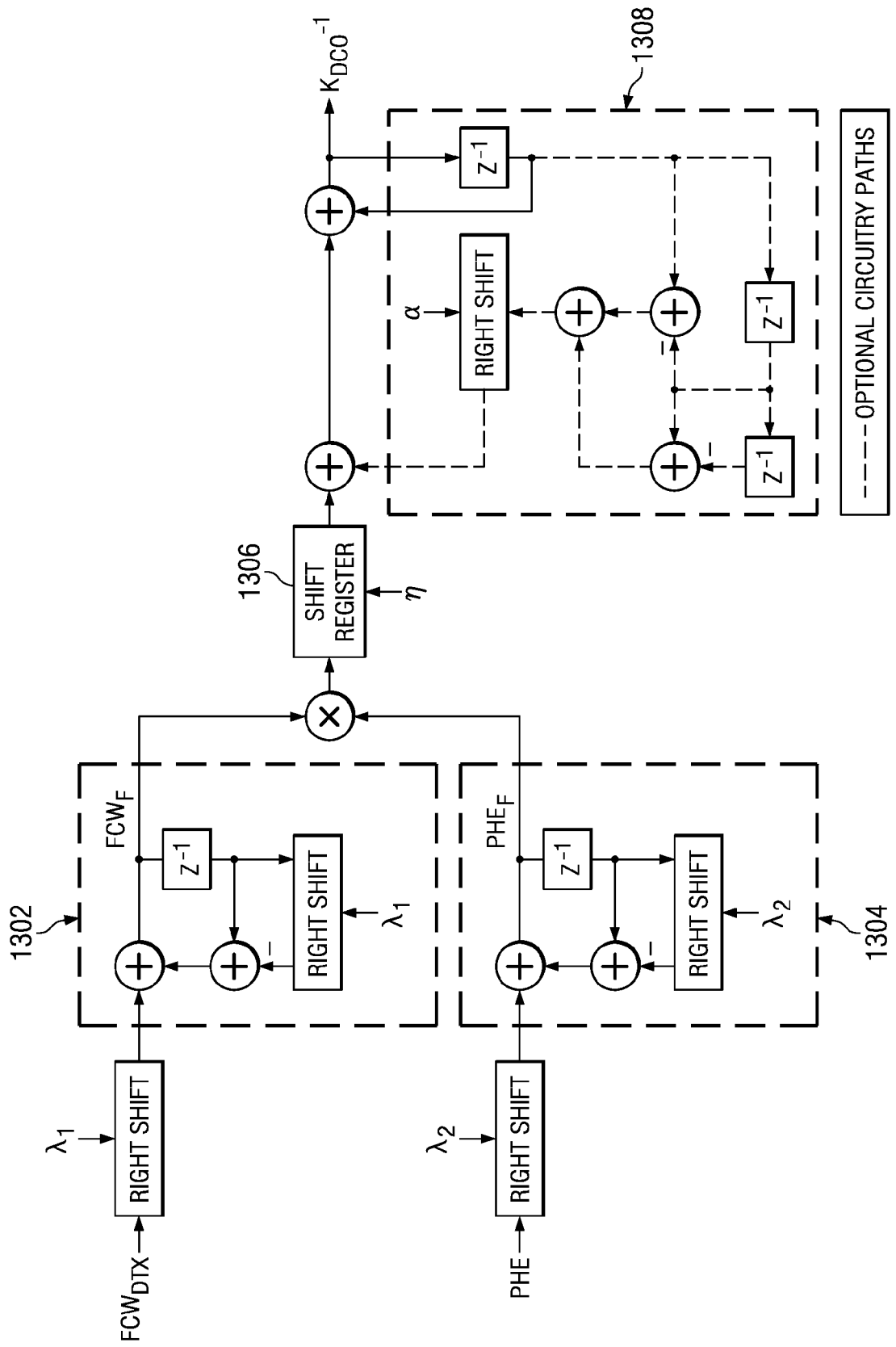
FIG. 13 is a block diagram of a hybrid stochastic gradient (HSG) $K_{DCO}$ normalizing factor calibration/compensation algorithm.

FIG. 13 is a block diagram of a hybrid stochastic gradient (HSG) $K_{DCO}$ normalizing factor calibration/compensation algorithm. A new $K_{DCO}$ adaptation algorithm is used in iADPLL 200 using the hybrid stochastic gradient (HSG) algorithm. The new algorithm is faster and more efficient as compared to the algorithm in ADPLL, with slightly higher hardware cost/complexity. The algorithm is primarily used for initial calibration and compensation using a pilot square wave training sequence. However, the algorithm because of its nature can also be tuned to work with arbitrary modulation waveform.

The new algorithm computes a stochastic sampled gradient between the filtered frequency modulation input (FCW) from FCW filter 1302 and the filtered zero-mean raw phase error (PHE) from PHE filter 1304 to compute the correction to the $K_{DCO}$ scaling value used in both reference and direct modulation paths of the iADPLL.

The algorithm has been efficiently implemented using first order IIR filters on the incoming FCW and PHE inputs. The filters not only reduce the noise on these signals especially the raw phase error, but are also used to time align the filtered FCW and PHE signals. The correction gradient is computed to be the product of these IIR filters, which is then scaled appropriately using a shift operation 1306 to compute the correction to be applied to the $K_{DCO}$ normalizing factor(s).

An optional momentum circuitry 1308 (or hysteresis filter) can be employed to further smoothen the computed value of the $K_{DCO}$ normalizing factor. This step is only required if the algorithm is used for background calibration with modulation.

Integer Channel Mitigation by Reference Clock Dithering

The purpose of reference dithering is to combat two independent issues which cause degradation of phase error of transmitted symbols on integer and to a lesser extent half-integer channels:

Fine FREF Dithering: Performance degradation due to the quantization error of the TDC. In short, the TDC quantization error causes the frequency/phase error between the desired frequency and the frequency produced by the DCO to periodically accumulate before it gets corrected by the loop, thus causing tonal content at the TX output. The fine dithering signal, according to the principles of the present invention, will generally be referred to as a short sequence dither signal. In general, they are short, periodic, high frequency content signals that are used to perturb the reference signal in time domain or amplitude domain or both.

Coarse FREF dithering is applied to desensitize iADPLL from the coupling of RF and other interference signals onto FREF.

Both fine and coarse reference dithering are controlled independently. Therefore they can be running concurrently. However, the system will be impacted by the overall dither amount. Dithering is described in more detail in U.S. patent application Ser. No. 11/853,182 filed Oct. 1, 2007 entitled "Adaptive spectral noise shaping to improve time to digital converter quantization resolution using dithering" and is incorporated herein by reference in its entirety.

Figure 14:
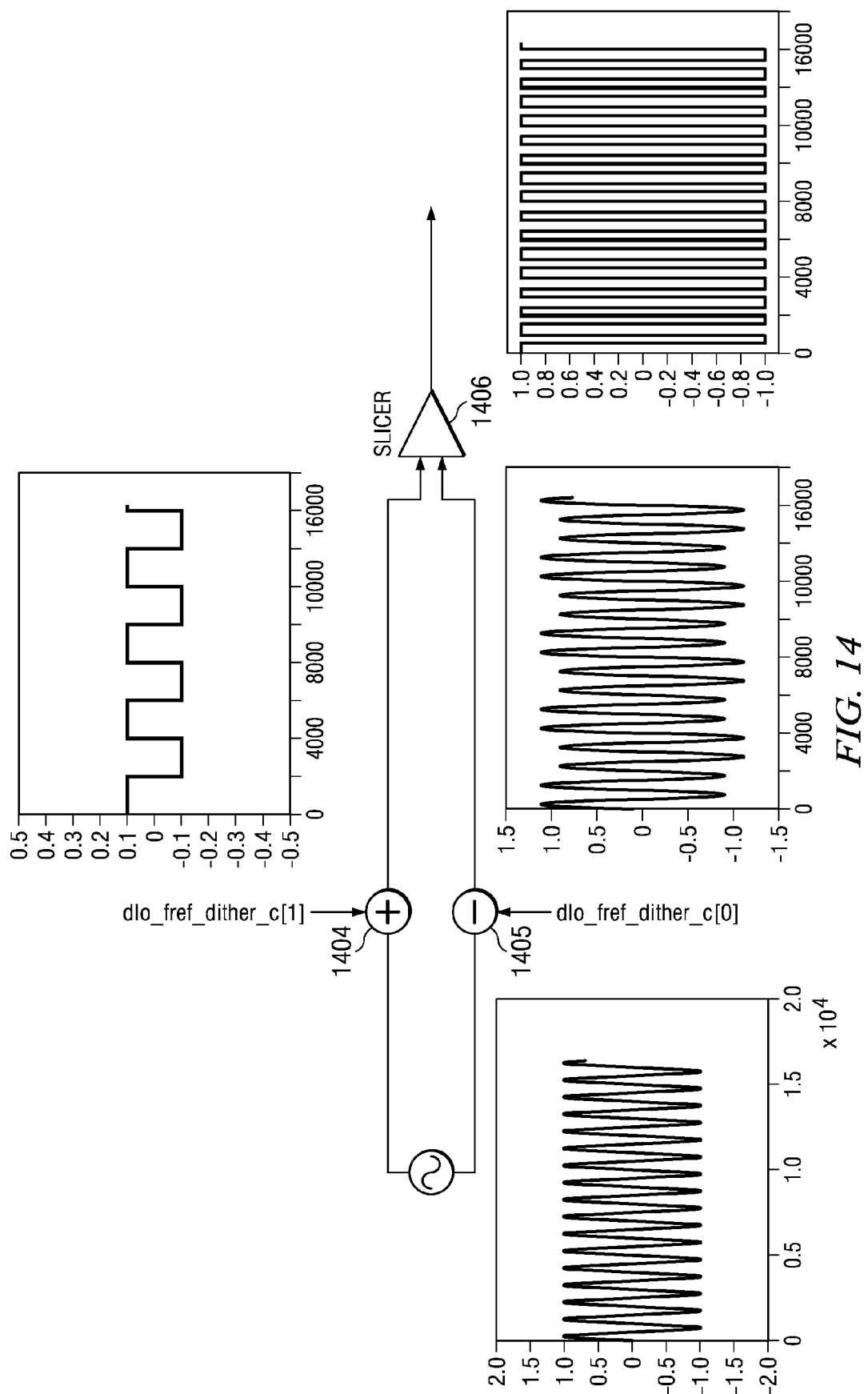
FIG. 14 is an illustration of coarse dithering applied to the slicer of the reference frequency generator.

FIG. 14 is an illustration of coarse dithering applied to inputs of the slicer of the reference frequency generator, such as DCXO 154 of FIG. 1. RF signal coupling on FREF is a parasitic phenomenon that potentially corrupts the reference signal. The dirty reference-clock can be further magnified by TDC quantization non-linearity in ADPLL loop dynamics. Coarse dithering is applied 1404, 1405 on the reference signal at slicer inputs as a mismatch-induced DC offset to the sinusoidal reference signal. The DC offset moves the zero crossing of the reference signal. The slicer 1406 converts the sinusoidal reference wave into rectangular wave with its edges corresponding to the new zero-crossings. Since the coarse dither signal is much stronger than the RF interference signal, the reference signal gets phase modulated by the dither signal with some dithering around it caused by the RF interference. If the coarse dither signal is chosen to have higher frequency compared to ADPLL loop filter bandwidth, the modulation caused by coarse dithering as well as RF coupling will be filtered out by the loop filter. In this embodiment, coarse dither is actually a perturbation to the zero-crossings of the reference frequency signal. The dithering circuit is described in more detail in U.S. patent application Ser. No. 12/021,205 filed Jan. 28, 2008 entitled "VARIABLE DELAY OSCILLATOR BUFFER" and is incorporated herein by reference in its entirety.

The TDC (Time to Digital Converter) converts the time delay between FREF clock and CKV clock to a digital word. TDC as a quantizer can only resolve delays specified by its resolution, in this case the inverter delay. When the CKV clock edge with respect to FREF clock edge is idle, the quantizer is inadequate to represent the delay offset between the two. For an integer channel operation, non-modulated CKV clock aligns with FREF clock with some offset. Due to low frequency noise in the system the delay may drift within an inverter delay while TDC is unable to detect such changes. The delay range of the inverter delay is like a dead zone that ADPLL is unable to correct for. The undetected error can worsen the overall ADPLL performance. The effect of TDC quantization error is related to the frequency contents of this noise because it is filtered by the ADPLL's $4^{th}$ order IIR filter. High frequency content of the TDC quantization noise is much more desirable over low frequency content of the quantization noise due to frequency selective nature of ADPLL. While CKV clock edge is trapped in TDC dead zone, the state of the ADPLL can nurture certain oscillation within this deadzone. These oscillations are called limit-cycles that show up as undesirable, "mysterious" idle tones at RF output. The purpose of dithering is to rescue CKV clock from dead zone by causing random perturbation in FREF clock edges. Dithering is an intentional noise injected in the iADPLL loop, and thus it will introduce additional phase noise at the iADPLL output. However this noise can be high pass shaped so that the overall iADPLL noise due to dithering is minimum. Higher order high pass shaping of the dither noise is not necessarily always a good idea. The amount of high pass shaping required is dependent on the iADPLL loop filters. For example, the iADPLL has a $4^{th}$ order IIR filter, therefore a reasonable choice of high pass shaping is $3^{rd}$ order or at most $4^{th}$ order since the DCO 1/s frequency-to-phase conversion provides additional pole for low frequency filtering. The fine dithering signals are designed to be either noise shaped by ΣΔ or short (high frequency) periodic pattern.

Generation of Dithering Sequences

Figure 15:
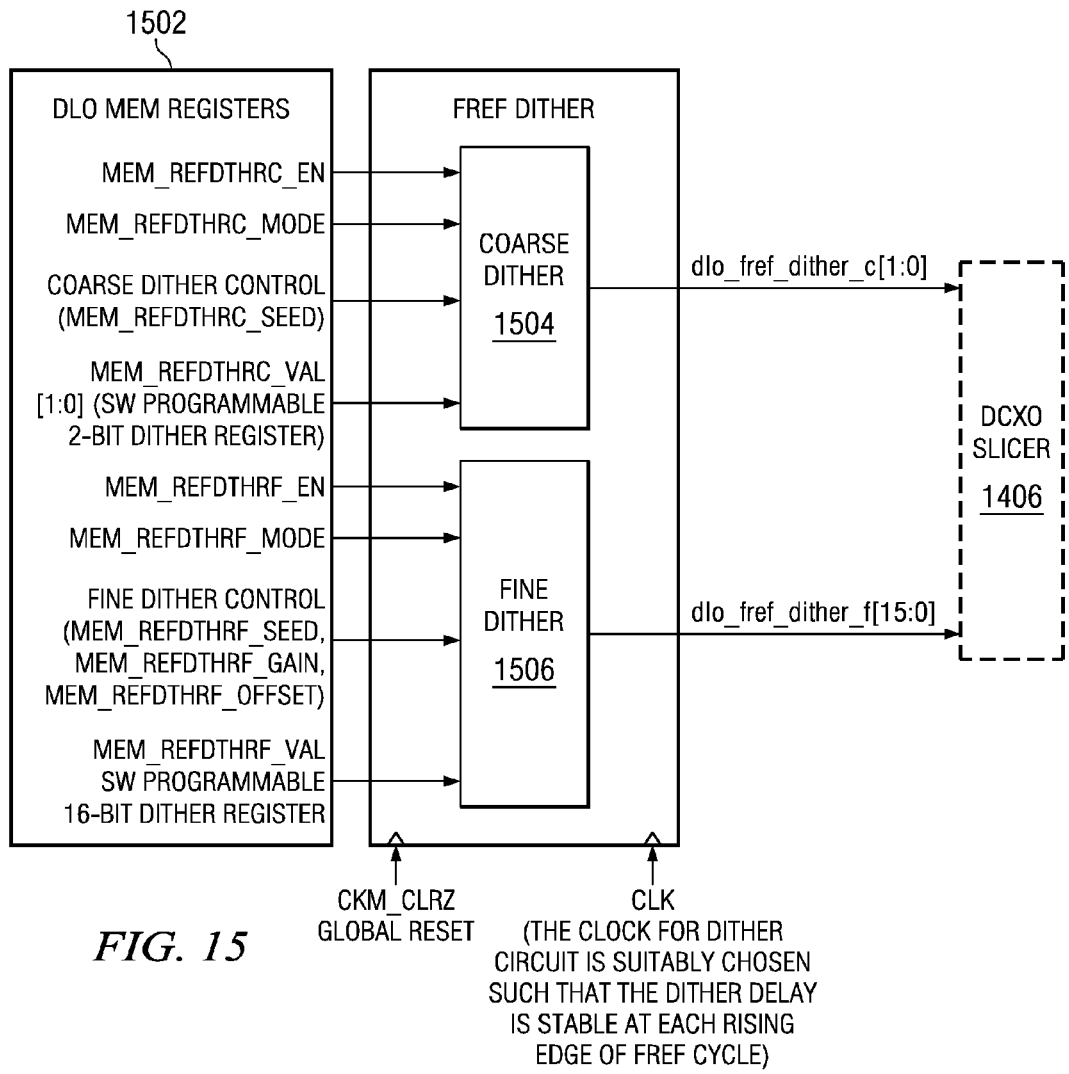
FIG. 15 is a block diagram of circuit for providing both coarse and fine dithering to the slicer input.
Figure 16:
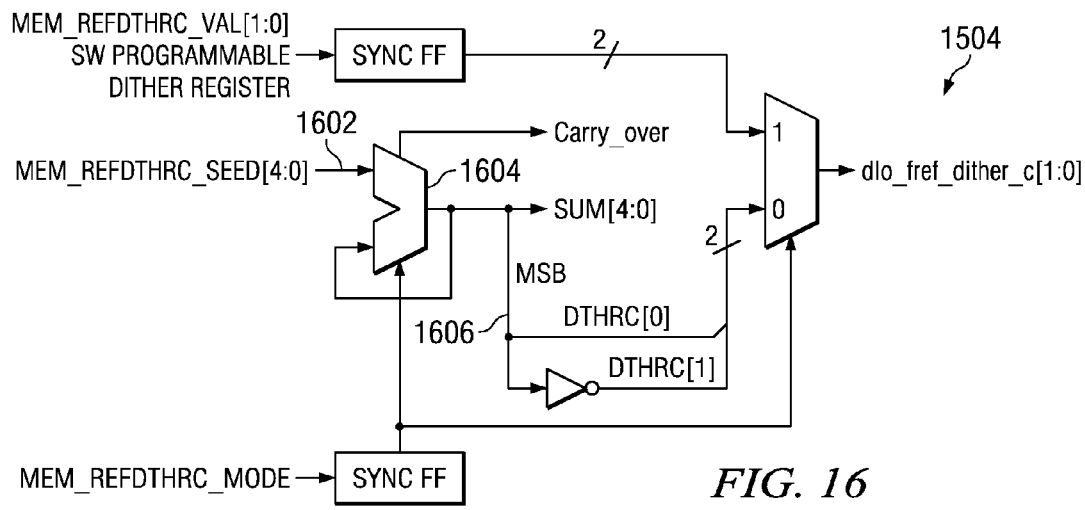
FIG. 16 is a more detailed block diagram of the course dither circuit of FIG. 15.

FIG. 15 is a block diagram of circuit for providing both coarse and fine dithering to the slicer input. This section describes the various types of reference clock dithering schemes implemented in the iADPLL. Control registers 1502 are connected to a system control processor, such as processor 146 of FIG. 1, and can be set with various parameters as needed to control dithering. Coarse dither circuit 1504 generates a square wave dither signal, as discussed above and illustrated in more detail in FIG. 16. Fine dither circuit 1506 generates various types of fine dithering signals, as will be described in more detail below. In general, the fine dither signal generates zero-crossing deviation extent of approximately 4-6 ps per step, total of which is slightly longer than one inverter delay for the circuitry of the present embodiment. The coarse dither signal has generates zero-crossing deviation of approximately 200 ps. In other embodiments, the zero-crossing deviation would be adjusted according to inverter delay.

Integer Channel Mitigation by CKV Phase Rotation

Figure 17:
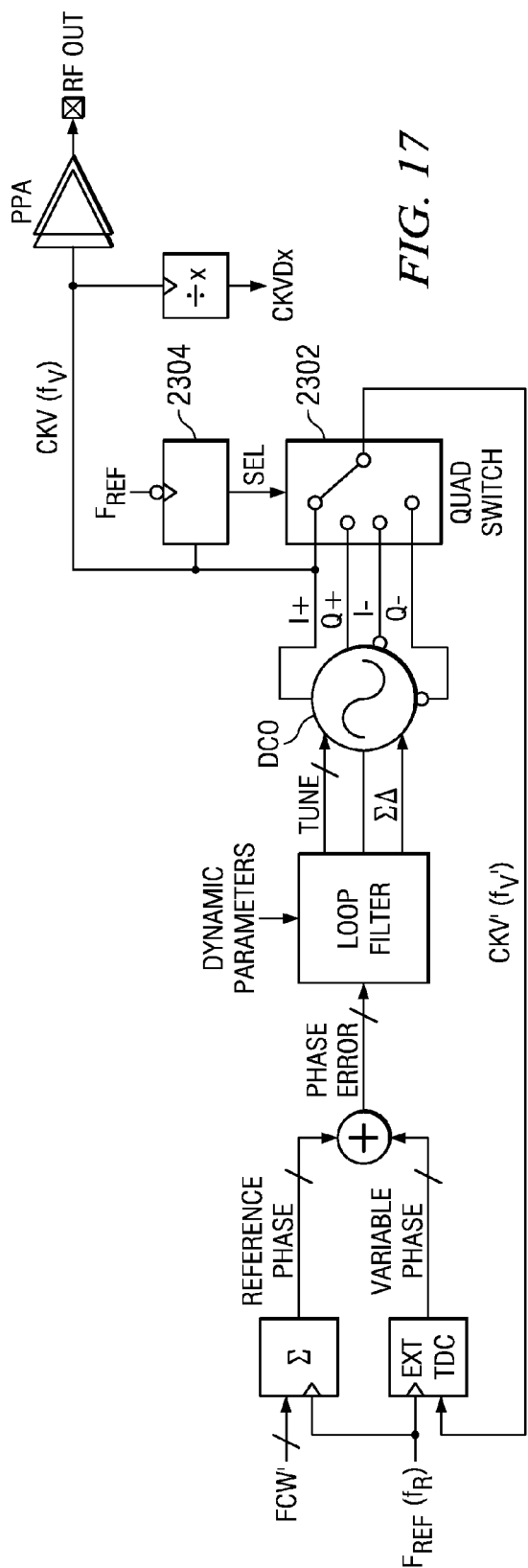
FIG. 17 is a conceptual block diagram illustrating quadrature CKV rotation in the iADPLL of FIG. 2.

FIG. 17 is a conceptual block diagram illustrating quadrature CKV rotation in the iADPLL of FIG. 2. At integer-N channels (i.e., channels at which the ratio between LO frequency and FREF is an integer), at near integer-N channels, and to a lesser extend at half-integer channels (i.e., FCW ratios which are a multiple of 0.5 but not exact integers), phase noise of ADPLL may degrade since TDC is in a deadband condition. In this case, the timing relationship between the two clocks that the TDC receives is substantially constant and various TDC codes are not exercised. The well known large-signal approximation used in the field of the ADC design to model the quantization noise as a uniformly distributed noise is no longer valid there. This can give rise to idle tones that can get modulated. Another issue of operating at integer-N channels is a possibility of the LO clock coupling back into the TDC circuitry and affecting the FREF edges. The method described below can be used in addition to dithering of the reference clock edges as explained in the section above, which tries to relieve the TDC out of dead-band by injection of noise. This embodiment of iADPLL also provides another method to improve RMS phase error of the transmitter under similar conditions by performing of quadrature phase rotation of CKV.

This method effectively rotates the phase of the variable clock to PLL feedback path (phase/frequency detector) by 90 degrees every FREF edge to knock the TDC out of its deadband. CKV phase can be either advanced or retarded by using the digital LO sequencing control signals. It should be noted that this operation takes place only for the feedback CKV clock to the iADPLL, the variable clock to the rest of the system including the amplitude path and the RF output remains to be the regular single phase CKV.

The simple trick that has been exploited in this scheme is that $FCW = f_V/f_R$ is perceived by the user of the ADPLL, but $FCW' = f_V'/f_R = f_V/f_R \pm \frac{1}{4}$ is visible only to the extended TDC, where the sign depends on the direction of CKV rotation.

CKV phase rotation operates as follows. "Extended TDC" is defined as the core TDC with the decoding circuitry, the normalizing gain multiplier, and the CKV edge counters. It produces the fixed-point variable phase $(R_V[k] - \epsilon[k])$ having integer and fractional parts. After every FREF cycle (alternatively after a number of CKV clock cycles), the CKV clock supplied to the extended TDC gets delayed (alternatively advanced) by a quarter of the CKV clock cycle by quad switch 2302. Phase select controller 2304 controls the phase selection sequencing of quad switch 2302 through the select control signal SEL. Since the TDC operates on the rising FREF edge events, it virtually disregards any CKV activity not immediately preceding the FREF events. To properly maintain the appearance of the frequency multiplication ratio FCW to the external user, the internal value of FCW' needs to be appropriately adjusted lower.

The phase rotation does not have to be in general increment/decrement or rotation, although rotation is a convenient scheme to implement. Other embodiments may use other schemes such as a random phase selection, for example. Likewise, the phase relationship does not have to be four phases with a quadrature or the 90 degree relationship. Other embodiments may use phases other than quadrature, such as three phases with 120° phases, for example.

Figure 18:
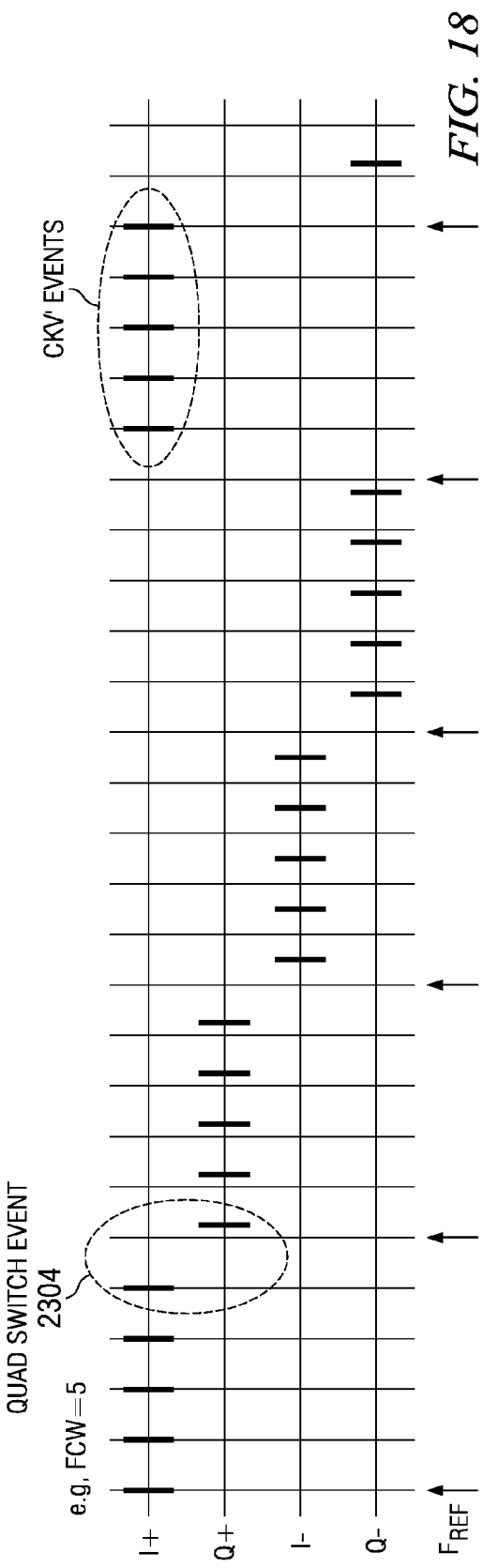
FIG. 18 is a plot illustrating quadrature CKV rotation when a frequency control work (FCW) has a value of integer five.

In the illustrated example in FIG. 18, the FCW value is an integer of 5. Every 5 CKV clock cycles or every FREF clock cycle, the CKV' that is connected to the TDC gets delayed. The TDC perceives it as if the DCO period is (5+¼)/5 of the actual DCO period. In general, the perceived DCO period is $$T_V' = T_V(FCW+¼)/FCW = T_V(1+1/(4*FCW))$$

The quad switch change could be done safely away from the rising FREF edges. The switching perturbations on the CKV' are acceptable if the integer counting part of the extended TDC is powered down. The counting of CKV edges for the purpose of calculating the integer part of the variable phase is not needed once the iADPLL output frequency is locked. The CKVDx (i.e., CKV divided down by x, where x=8 for CKVD8) is based on CKV clock, which is not perturbed.

For proper operation with CKV phase rotation, the following sequence must be followed:

a) Disable use of integer part of variable phase. This also needs to be taken care of in calculation of script processor computations, such as FREQ_ERR (differentiated value equivalent of the phase error PHE).

b) Freeze the loop (PHE calculation) for at least 2 FREF cycles, and test for proper TDC operation c) Enable CKV phase rotation synchronously to FREF/CKR but safely away from FREF rising edge; and at about the same time, as indicated at 2304 d) Update FCW to FCW'

Equation for new FCW (visible to ADPLL)

$$FCW' = FCW \pm ¼ \qquad (23)$$

For example, $f_V$=1742 MHz, $f_R$=26 MHz, then Under normal operational conditions, FCW=67; but, FCW'=66.75 for +90 deg rotation, and FCW'=67.25 for −90 deg rotation Variable Phase Integer Freeze Capability LO phase rotation can cause ADPLL to get out of lock unless it supports a mechanism to handle the large known phase shifts caused by such rotation. This capability to handle large phase shifts in LO can be realized by variable phase integer freeze/disable capability.

Interpolative ADPLL operates by sampling reference clock phase using LO clock signal. This generates variable phase information which is represented digitally with a wide integer range and fine fractional resolution. Proposed solution to the above described issue is to create an ADPLL mode, in which iADPLL can handle large but known phase shifts.

a) This is done by first locking the ADPLL to the desired RF frequency and then engage in a mode of operation in which higher-magnitude phase information can be ignored and only lower-magnitude phase information is used to keep the ADPLL frequency locked.

b) Once the ADPLL is locked, then under normal operation, the higher integer magnitude phase is very predictable.

c) For a short duration, this higher integer phase can also be generated (or frozen to a known value) internally if required for the correct operation of the interpolative phase resampler of the iADPLL.

Practically, this implies that the integer part of the iADPLL variable phase information is ignored at every reference clock edge. This would not cause the iADPLL to react to larger magnitude phase shifts in LO. This is an enabler to the LO phase rotation capability which helps with TDC dead-band issues while dynamically keeping the ADPLL locked.

Figure 19:
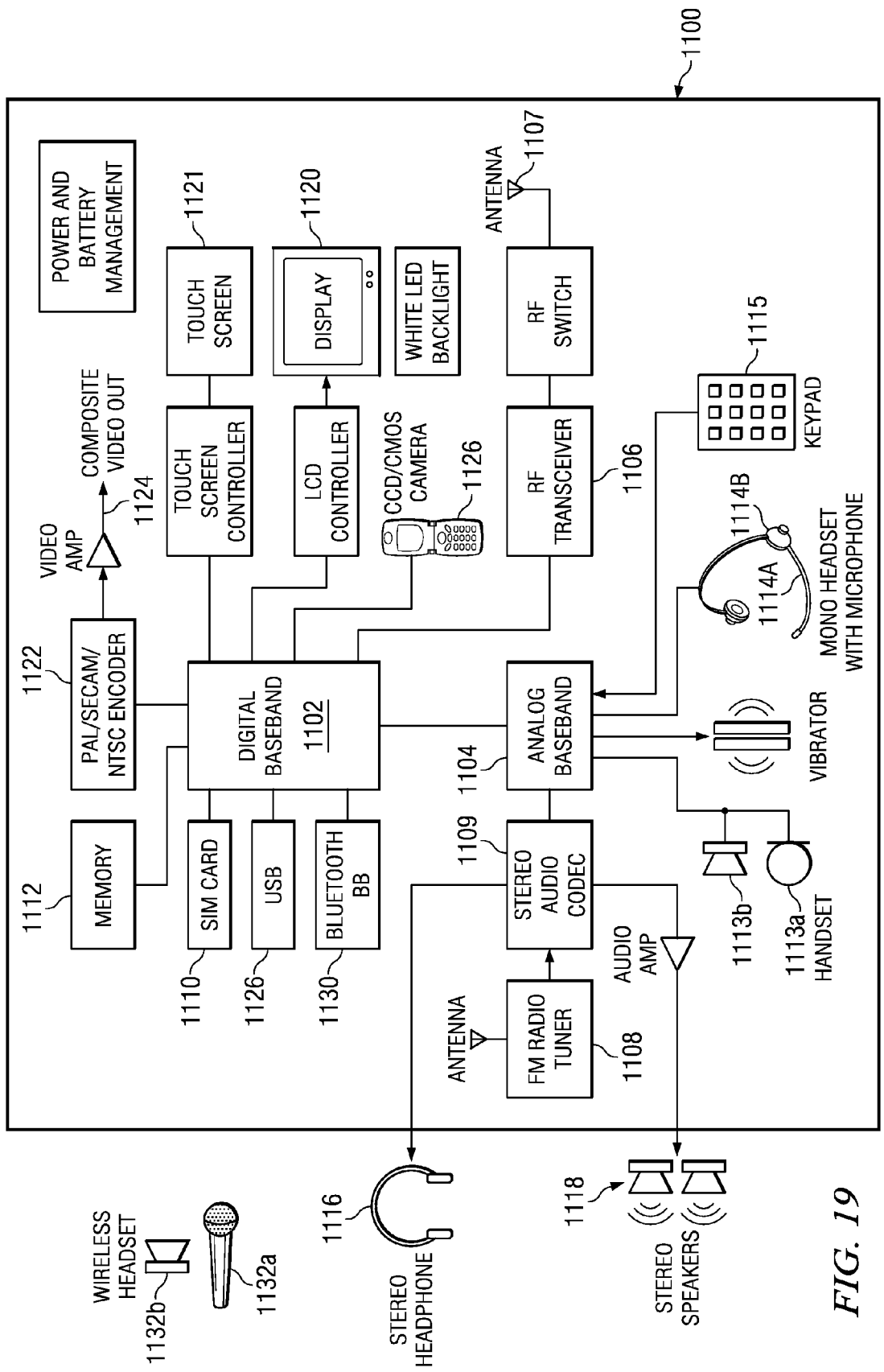
FIG. 19 is a block diagram of a digital system with an embodiment of an iADPLL within a digital radio transceiver.

FIG. 19 is a block diagram of a digital system with an embodiment of an iADPLL within a digital radio transceiver, as described above. Digital system 1100 a representative cell phone that is used by a mobile user. Digital baseband (DBB) unit 1102 is a digital processing processor system that includes embedded memory and security features. In this embodiment, DBB 1102 is an open media access platform (OMAP™) available from Texas Instruments designed for multimedia applications. Some of the processors in the OMAP family contain a dual-core architecture consisting of both a general-purpose host ARM™ (advanced RISC (reduced instruction set processor) machine) processor and one or more DSP (digital signal processor). The digital signal processor featured is commonly one or another variant of the Texas Instruments TMS320 series of DSPs. The ARM architecture is a 32-bit RISC processor architecture that is widely used in a number of embedded designs.

Analog baseband (ABB) unit 1104 performs processing on audio data received from stereo audio codec (coder/decoder) 1109. Audio codec 1109 receives an audio stream from FM Radio tuner 1108 and sends an audio stream to stereo headset 1116 and/or stereo speakers 1118. In other embodiments, there may be other sources of an audio stream, such a compact disc (CD) player, a solid state memory module, etc. ABB 1104 receives a voice data stream from handset microphone 1113a and sends a voice data stream to handset mono speaker 1113b. ABB 1104 also receives a voice data stream from microphone 1113a and sends a voice data stream to mono headset 1114b. Previously, ABB and DBB were separate ICs but here are integrated into one IC. In most embodiments, ABB does not embed a programmable processor core, but performs processing based on configuration of audio paths, filters, gains, etc being setup by software running on the DBB. In an alternate embodiment, ABB processing is performed on the same OMAP processor that performs DBB processing. In another embodiment, a separate DSP or other type of processor performs ABB processing.

RF transceiver 1106 is a digital radio processor and includes a receiver for receiving a stream of coded data frames from a cellular base station via antenna 1107 and a transmitter for transmitting a stream of coded data frames to the cellular base station via antenna 1107. At the heart of transceiver 1106 lies a digitally controlled oscillator (DCO), which deliberately avoids any analog tuning controls. Fine frequency resolution is achieved through high-speed dithering of its varactors. Digital logic built around the DCO realizes an interpolative all-digital PLL (iADPLL) that is used as a local oscillator for both the transmitter and receiver and operates as described above. Operation of the iADPLL is described in more detail with reference to the preceding Figures. The polar transmitter architecture utilizes the wideband direct frequency modulation capability of the iADPLL and a digitally controlled power amplifier (DPA) for the power ramp and amplitude modulation. In this embodiment, a single transceiver supports both GSM and WCDMA operation but other embodiments may use multiple transceivers for different transmission standards. Other embodiments may have transceivers for a later developed transmission standard with appropriate configuration. RF transceiver 1106 is connected to DBB 1102 which provides processing of the frames of encoded data being received and transmitted by cell phone 1100.

The basic WCDMA DSP radio consists of control and data channels, rake energy correlations, path selection, rake decoding, and radio feedback. Interference estimation and path selection is performed by instructions stored in memory 1112 and executed by DBB 1102 in response to signals received by transceiver 1106. Programmable features of the iADPLL within transceiver 1106 are controlled by instructions executed by DBB 1102.

DBB unit 1102 may send or receive data to various devices connected to USB (universal serial bus) port 1126. DBB 1102 is connected to SIM (subscriber identity module) card 1110 and stores and retrieves information used for making calls via the cellular system. DBB 1102 is also connected to memory 1112 that augments the onboard memory and is used for various processing needs. DBB 1102 is connected to Bluetooth baseband unit 1130 for wireless connection to a microphone 1132*a* and headset 1132*b* for sending and receiving voice data.

DBB 1102 is also connected to display 1120 and sends information to it for interaction with a user of cell phone 1100 during a call process. Display 1120 may also display pictures received from the cellular network, from a local camera 1126, or from other sources such as USB 1126.

DBB 1102 may also send a video stream to display 1120 that is received from various sources such as the cellular network via RF transceiver 1106 or camera 1126. DBB 1102 may also send a video stream to an external video display unit via encoder 1122 over composite output terminal 1124. Encoder 1122 provides encoding according to PAL/SECAM/NTSC video standards.

As used herein, the terms "applied," "connected," and "connection" mean electrically connected, including where additional elements may be in the electrical connection path. "Associated" means a controlling relationship, such as a memory resource that is controlled by an associated port. The terms assert, assertion, de-assert, de-assertion, negate and negation are used to avoid confusion when dealing with a mixture of active high and active low signals. Assert and assertion are used to indicate that a signal is rendered active, or logically true. De-assert, de-assertion, negate, and negation are used to indicate that a signal is rendered inactive, or logically false.

While the invention has been described with reference to illustrative embodiments, this description is not intended to be construed in a limiting sense. Various other embodiments of the invention will be apparent to persons skilled in the art upon reference to this description. This invention applies to all scheduled communication systems which perform power control and channel sounding across multiple resource blocks. This invention applies in uplink and downlink. The embodiments of this invention apply for all modulation strategies, which include but are not limited to, OFDMA, CDMA, DFT-spread FDMA, SC-OFDMA, and others. Embodiments of this invention can be applied in most if not all emerging wireless standards, including EUTRA.

While a mobile user equipment device has been described, embodiments of the invention are not limited to mobile devices. Desktop equipment and other stationary equipment being served by a cellular network may also embody an iADPLL as described herein.

Although the invention finds particular application to Digital Signal Processors (DSPs), implemented, for example, in an Application Specific Integrated Circuit (ASIC), it also finds application to other forms of processors. An ASIC may contain one or more megacells which each include custom designed functional circuits combined with pre-designed functional circuits provided by a design library.

While the invention has been described with reference to illustrative embodiments, this description is not intended to be construed in a limiting sense. Various other embodiments of the invention will be apparent to persons skilled in the art upon reference to this description.

It is therefore contemplated that the appended claims will cover any such modifications of the embodiments as fall within the true scope and spirit of the invention.

What is claimed is:

1. A digital system comprising a gear shift apparatus, wherein the gear shift apparatus comprises:
    a proportional gain circuit having a coefficient alpha, the proportional gain circuit having an input for receiving a data stream and having an output;
    an integral gain circuit having a coefficient rho, the integral circuit having an input to receive the data stream and having an output coupled via an adder to the output of the proportional gain circuit; and
    a controllable circuit connected to provide alpha and rho, wherein alpha and rho are adjusted in unison to produce a gear shift operation, and wherein values of alpha and rho are selected to maintain an approximately constant ratio of alpha to square root of rho.

2. The digital system of claim 1, further comprising a clock operational to generate a clock signal to control synchronous operation of said gear shift apparatus, wherein said adjusting of alpha and rho are performed within a same clock cycle of the clock signal.

3. A system comprising a phase locked loop (PLL) having a loop gain and a phase margin, wherein the PLL comprises:
    a frequency reference input for receiving a reference clock;
    a controllable oscillator for generating a radio frequency (RF) clock;
    a phase detection circuit operational to provide phase error samples indicative of phase difference between the RF clock and the reference clock for controlling the controllable oscillator;
    a programmable filter connected to receive the phase error samples and connected to provide a filtered output to the controllable oscillator, the programmable filter comprising a proportional loop gain control having a programmable loop coefficient (alpha) and an integral loop gain control having a programmable loop coefficient (rho); and
    wherein alpha and rho are configured to be programmatically changed simultaneously and wherein values of alpha and rho are selected to maintain an approximately constant ratio of alpha and square root of rho.

4. The system of claim 3, wherein the loop gain and the phase margin are above a certain limit during the alpha and rho changes.

5. The system of claim 3, wherein values for alpha and rho are selected such that the loop gain is changed and the phase margin remains better than a certain limit.

6. The system of claim 3 being a cellular telephone, wherein the PLL forms a local oscillator.

7. A system comprising a phase locked loop (PLL) having a loop gain and a phase margin, wherein the PLL comprises:
    a frequency reference input for receiving a reference clock;
    a controllable oscillator for generating a radio frequency (RF) clock;

a phase detection circuit operational to provide phase error samples indicative of phase difference between the RF clock and the reference clock for controlling the controllable oscillator;

a programmable filter connected to receive the phase error samples and connected to provide a filtered output to the controllable oscillator, the programmable filter comprising a proportional loop gain control having a programmable loop coefficient (alpha) and an integral loop gain control having a programmable loop coefficient (rho); and wherein alpha and rho are configured to be programmatically changed simultaneously and wherein values for the alpha and rho are selected such that the loop gain is changed and the phase margin remains substantially unchanged.

8. A system comprising a phase locked loop (PLL) having a loop gain and a phase margin, wherein the PLL comprises:

a frequency reference input for receiving a reference clock;

a controllable oscillator for generating a radio frequency (RF) clock;

a phase detection circuit operational to provide phase error samples indicative of phase difference between the RF clock and the reference clock for controlling the controllable oscillator;

a programmable filter connected to receive the phase error samples and connected to provide a filtered output to the controllable oscillator, the programmable filter comprising one or more linear filters each having a programmable linear filter coefficient, coupled to first receive the phase error samples, a proportional loop gain control having a programmable loop coefficient (alpha) and an integral loop gain control having a programmable loop coefficient (rho), wherein alpha and rho are configured to be programmatically changed simultaneously; and wherein the programmable filter coefficients are configured such that at least one linear filter coefficient is changed simultaneously with alpha and rho, such that bandwidth of the filter is changed and phase margin remains substantially unchanged.

9. A system comprising a phase locked loop (PLL) having a loop gain and a phase margin, wherein the PLL comprises:

a frequency reference input for receiving a reference clock;

a controllable oscillator for generating a radio frequency (RF) clock;

a phase detection circuit operational to provide phase error samples indicative of phase difference between the RF clock and the reference clock for controlling the controllable oscillator;

a programmable filter connected to receive the phase error samples and connected to provide a filtered output to the controllable oscillator, the programmable filter comprising one or more linear filters each having a programmable linear filter coefficient, coupled to first receive the phase error samples, a proportional loop gain control having a programmable loop coefficient (alpha) and an integral loop gain control having a programmable loop coefficient (rho), wherein alpha and rho are configured to be programmatically changed simultaneously; and wherein the programmable filter coefficients are configured such that at least one linear filter coefficient is changed before or after changing alpha and rho, such that bandwidth of the filter is changed and phase margin remains substantially unchanged.

10. A method for operating a phase locked loop having a loop gain and a phase margin, comprising:

generating a radio frequency (RF) clock using a controllable oscillator;

calculating phase error samples indicative of phase difference between the RF clock and a reference clock for controlling the controllable oscillator;

filtering the phase error samples using a linear filter, a proportional loop gain controller and an integral loop gain controller; and changing bandwidth of the filter by changing a proportional loop gain coefficient (alpha) and an integral loop gain coefficient (rho) simultaneously such that the loop gain is changed and the phase margin remains above a certain limit, wherein values of alpha and rho are selected to maintain an approximately constant ratio of alpha over square root of the rho.

11. The method of claim 10, wherein values for the alpha and rho are selected such that the loop gain is changed and the phase margin remains above a certain limit.

12. The method of claim 10, further comprising filtering the phase error samples with one or more linear filters each having a programmable linear filter coefficient.

13. The method of claim 12, wherein changing bandwidth further comprises changing one or more of the linear filter coefficients.

14. The method of claim 13, wherein changing bandwidth further comprises changing the one or more of the linear filter coefficients simultaneously with changing the alpha and rho.

15. The method of claim 13, wherein values for alpha, rho and the coefficients for the linear filters are selected such that the loop bandwidth and the loop gain are changed, while the phase margin remains above a certain limit.

16. A method for operating a phase locked loop having a loop gain and a phase margin, comprising:

generating a radio frequency (RF) clock using a controllable oscillator;

calculating phase error samples indicative of phase difference between the RF clock and a reference clock for controlling the controllable oscillator;

filtering the phase error samples using one or more linear filters each having a programmable linear filter coefficient, a proportional loop gain controller and an integral loop gain controller; and changing bandwidth of the filter by changing one or more of the linear filter coefficients, a proportional loop gain coefficient (alpha) and an integral loop gain coefficient (rho) simultaneously such that the loop gain is changed and the phase margin remains above a certain limit, wherein values for alpha, rho and the coefficients for the linear filters are selected to maintain an approximately constant relationship of a PLL damping factor.

17. A cellular telephone comprising:

a reference frequency generator for forming a reference clock;

a transmitter connected to receive the reference clock, comprising:

a phase locked loop (PLL) having a loop gain and a phase margin, wherein the PLL comprises:

a controllable oscillator for generating a radio frequency (RF) clock;

phase detection circuit operational to provide phase error samples indicative of phase difference between the RF clock and the reference clock for controlling the controllable oscillator;

a data modulating input for providing frequency deviation commands operable to adjust the frequency of the controllable oscillator thereby providing frequency modulation of the local oscillator; and a loop filter with a gear shifting circuit connected between the phase detection circuit and the controllable oscillator, wherein the gear shift circuit comprises:
- a proportional loop gain circuit having a coefficient alpha, the proportional gain circuit having an input for receiving a data stream and having an output;
- an integral gain circuit having a coefficient rho, the integral circuit having an input to receive the data stream and having an output coupled via an adder to the output of the proportional gain circuit; and
- a controllable circuit connected to provide alpha and rho, wherein alpha and rho are adjusted in unison to produce a gear shift operation.

18. The cellular phone of claim 17, wherein values of alpha and rho are selected to maintain an approximately constant ratio of the alpha to square root of the rho.

19. The cellular telephone of claim 17, wherein values for alpha and rho are selected such that the loop gain of the PLL is changed and the phase margin of the PLL remains substantially unchanged.

20. The cellular phone of claim 19, wherein the programmable filter further comprises one or more linear filters each having a programmable linear filter coefficient, coupled to first receive the phase error samples, and wherein the programmable filter coefficients are configured to such that at least one linear filter coefficient is changed simultaneously with alpha and rho, such that bandwidth of the filter is changed and phase margin remains above a certain limit.

21. The cellular phone of claim 19, wherein the programmable filter further comprises one or more linear filters each having a programmable linear filter coefficient, coupled to first receive the phase error samples, and wherein the programmable filter coefficients are configured to such that at least one linear filter coefficient is changed before or after changing alpha and rho, such that bandwidth of the filter is changed and phase margin remains above a certain limit.

22. The cellular phone of claim 17, wherein the programmable filter further comprises one or more linear filters each having a programmable linear filter coefficient, coupled to first receive the phase error samples, and wherein the programmable filter coefficients are configured to such that at least one linear filter coefficient is changed simultaneously with alpha and rho, such that bandwidth of the filter is changed and phase margin remains substantially unchanged.

23. The cellular phone of claim 17, wherein the programmable filter further comprises one or more linear filters each having a programmable linear filter coefficient, coupled to first receive the phase error samples, wherein the programmable filter coefficients are configured such that at least one linear filter coefficient is changed before or after changing alpha and rho, such that bandwidth of the filter is changed and phase margin remains substantially unchanged.

* * * * *